US011024788B2

(12) United States Patent
Sun et al.

(10) Patent No.: US 11,024,788 B2
(45) Date of Patent: Jun. 1, 2021

(54) FLEXIBLE THERMOELECTRIC GENERATOR AND METHOD FOR FABRICATING THE SAME

(71) Applicant: Nano and Advanced Materials Institute Limited, Hong Kong (CN)

(72) Inventors: Xinying Sun, Hong Kong (CN); Han Wang, Hong Kong (CN); Jianzhuo Xin, Hong Kong (CN); Jifan Li, Hong Kong (CN)

(73) Assignee: Nano and Advanced Materials Institute Limited, Hong Kong (CN)

( * ) Notice: Subject to any disclaimer, the term of this patent is extended or adjusted under 35 U.S.C. 154(b) by 0 days.

(21) Appl. No.: 16/655,438

(22) Filed: Oct. 17, 2019

(65) Prior Publication Data

US 2020/0136005 A1    Apr. 30, 2020

Related U.S. Application Data

(60) Provisional application No. 62/766,552, filed on Oct. 26, 2018.

(51) Int. Cl.
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
CPC ................................ H01L 35/32; H01L 35/34
See application file for complete search history.

(56) References Cited

U.S. PATENT DOCUMENTS

| 6,127,619 | A | * | 10/2000 | Xi | ............................ | H01L 35/16 |
| | | | | | | 136/201 |
| 6,410,971 | B1 | | 6/2002 | Otey | | |
| 2011/0154558 | A1 | * | 6/2011 | Peter | ....................... | H01L 35/34 |
| | | | | | | 2/243.1 |
| 2011/0186956 | A1 | * | 8/2011 | Hiroshige | ............... | H01B 1/128 |
| | | | | | | 257/467 |
| 2012/0042640 | A1 | * | 2/2012 | Limbeck | .................. | F01N 5/025 |
| | | | | | | 60/320 |
| 2013/0081663 | A1 | * | 4/2013 | Yang | ........................ | H01L 35/32 |
| | | | | | | 136/203 |
| 2017/0033272 | A1 | * | 2/2017 | Pedaci | ..................... | H01L 35/34 |

FOREIGN PATENT DOCUMENTS

JP     2008182160 A     8/2008

* cited by examiner

*Primary Examiner* — Jayne L Mershon
(74) *Attorney, Agent, or Firm* — Spruson & Ferguson (Hong Kong) Limited

(57) ABSTRACT

The present disclosure provides a thermoelectric generator and methods for fabricating the same. The semiconductor legs and electrodes of the thermoelectric generator are embedded in one or more flexible polymer matrices providing protection to the semiconductor legs and electrodes to maintain good electric contacts among them during bending. Thus, the output power of the thermoelectric generator can be substantially retained even after a large number of bending cycles.

13 Claims, 15 Drawing Sheets

FLEXIBLE THERMOELECTRIC GENERATOR AND METHOD FOR FABRICATING THE SAME

TECHNICAL FIELD

The present disclosure generally relates to a thermoelectric generator and methods for fabricating the same.

BACKGROUND ART

Recently, using thermoelectric generators for energy harvesting to provide electric power to electronic devices is getting more and more popular in various applications, especially, when the power source for electronic devices cannot be easily replaced or recharged. The output power of thermoelectric generators is always a major concern to industry but the flexibility of thermoelectric generators is also getting more important in certain applications, e.g., wearable electronic devices.

Conventional thermoelectric generators are covered by ceramic plates which are rigid, bulky and heavy. It is difficult for a thermoelectric generator to achieve high output power, long working time and good flexibility at the same time. In general, when more thermoelectric elements are used in a generator, the flexibility and reliability of the generator decrease. There is a tradeoff among these aspects based on conventional designs.

U.S. Pat. No. 6,410,971B1 disclose a flexible thermoelectric module having a pair of flexible substrates, electrically conductive contacts and thermoelectric elements. The electrical contacts and the thermoelectric elements are interposed between the pair of flexible substrates. Nevertheless, after several bending cycles, the connections among the electrical contacts and the thermoelectric elements are easily broken under such structure, leading to the drop of output power, or even the failure of the module.

A need therefore exists for a thermoelectric generator to eliminate or at least diminish the disadvantages and problems described above.

SUMMARY OF THE INVENTION

Provided herein is a thermoelectric generator comprising: an thermoelectric conversion layer having a first surface and a second surface and comprising a plurality of p-type semiconductor legs, a plurality of n-type semiconductor legs and a first flexible polymer matrix having a first thermal conductivity, wherein the first surface is opposite to the second surface, the plurality of p-type semiconductor legs and the plurality of n-type semiconductor legs define a plurality of thermoelectric couples and are embedded in the first flexible polymer matrix in a way that both ends of each p-type semiconductor leg are exposed to the first surface and the second surface respectively, both ends of each n-type semiconductor leg are exposed to the first surface and the second surface respectively, and the plurality of p-type semiconductor legs and the plurality of n-type semiconductor legs are separated by the first flexible polymer matrix; a plurality of first electrodes located on the first surface and coupled to the plurality of thermoelectric couples; a first flexible layer comprising a second flexible polymer matrix having a second thermal conductivity and covering the plurality of first electrodes and an exposed area of the first surface, the exposed area of the first surface is an area not covered by the plurality of first electrodes, such that the first surface is covered by the plurality of first electrodes and the second flexible polymer matrix; a plurality of second electrodes located on the second surface and coupled to the plurality of thermoelectric couples; and a second flexible layer comprising a third flexible polymer matrix having a third thermal conductivity and covering the plurality of second electrodes and an exposed area of the second surface, the exposed area of the second surface is an area not covered by the plurality of second electrodes, such that the second surface is covered by the plurality of second electrodes and the third flexible polymer matrix.

In certain embodiments, both of the second thermal conductivity and the third thermal conductivity are higher than the first thermal conductivity.

In certain embodiments, the first thermal conductivity is between 0.1 W/mK and 0.5 W/mK, the second thermal conductivity is between 0.5 W/mK and 3 W/mK, the third thermal conductivity is between 0.5 W/mK and 3 W/mK.

In certain embodiments, the first flexible polymer matrix has a composition comprising a first polymer, and both of the second flexible polymer matrix and the third flexible polymer matrix have a composition comprising a second polymer and one or more fillers.

In certain embodiments, the first polymer is polydimethylsiloxane (PDMS), thermoplastic polyurethane (TPU), or ethylene-vinyl acetate copolymer (EVA), and the second polymer is PDMS, TPU, EVA, or polyimide (PI).

In certain embodiments, the one or more fillers are silicon carbide (SiC), boron nitride (BN), aluminum oxide ($Al_2O_3$), aluminum nitride (AlN), graphite, a carbon nanotube (CNT), or a combination thereof.

In certain embodiments, the first polymer is PDMS, the second polymer is PDMS, the one or more fillers have two fillers including a combination of BN and AlN, a combination of BN and SiC, or a combination of AlN+$Al_2O_3$.

In certain embodiments, the thermoelectric generator has a thickness between 4.0 mm and 4.5 mm, the first flexible layer has a thickness between 1.5 mm and 1.0 mm, and the second flexible layer has a thickness between 1.5 mm and 1.0 mm.

In certain embodiments, the each p-type semiconductor leg comprises bismuth telluride ($Bi_2Te_3$), bismuth selenide ($Bi_2Se_3$), antimony telluride ($Sb_2Te_3$), $(Bi,Sb)_2Te_3$, iron antimonide ($FeSb_2$), lead telluride (PbTe), tin selenide (SnSe), or bismuth antimonide (BiSb), the each n-type semiconductor leg comprises $Bi_2Te_3$, $Bi_2Se_3$, $Sb_2Te_3$, $(Bi,Sb)_2Te_3$, $FeSb_2$, PbTe, SnSe, or BiSb.

In certain embodiments, the each p-type semiconductor leg has a size of $1.2 \times 1.2 \times 2.0$ mm$^3$, and the each n-type semiconductor leg has a size of $1.2 \times 1.2 \times 2.0$ mm$^3$.

In certain embodiments, the each first electrode comprises copper (Cu), silver (Ag), gallium-indium eutectic (EGaIn), or a conductive fabric, and the each second electrode comprises Cu, Ag, EGaIn, or the conductive fabric.

In certain embodiments, the thermoelectric generator described above further comprises a flexible heat dissipation layer attaching on the first flexible layer or the second flexible layer.

In certain embodiments, the flexible heat dissipation layer comprises a super absorption polymer, a cooling fabric, a water absorption paper, a phase change material, a metal foam, or a thermal conductive glue.

Provided herein is a method for fabricating the thermoelectric generator described above comprising: arranging the plurality of p-type semiconductor legs and the plurality of n-type semiconductor legs in an array; inserting a solution of the first flexible polymer matrix among the plurality of p-type semiconductor legs and the plurality of n-type semiconductor legs; curing the solution of the first flexible polymer matrix thereby forming the thermoelectric conversion layer; forming the plurality of first electrodes on the first surface; forming the first flexible layer on the plurality of first electrodes and the exposed area of the first surface; forming the plurality of second electrodes on the second surface; and forming the second flexible layer on the plurality of second electrodes and the exposed area of the second surface.

In certain embodiments, the step of forming the first flexible layer comprises: inserting a solution of the second flexible polymer matrix on the plurality of first electrodes and the exposed area of the first surface; and curing the solution of the second flexible polymer matrix thereby forming the first flexible layer.

In certain embodiments, the step of forming the second flexible layer comprises: inserting a solution of the third flexible polymer matrix on the plurality of second electrodes and the exposed area of the second surface; and curing the solution of the third flexible polymer matrix thereby forming the second flexible layer.

Provided herein is a thermoelectric generator comprising: an thermoelectric conversion layer having a first surface and a second surface, and comprising a plurality of p-type semiconductor legs, a plurality of n-type semiconductor legs, and a flexible polymer matrix, wherein the first surface is opposite to the second surface, the plurality of p-type semiconductor legs and the plurality of n-type semiconductor legs define a plurality of thermoelectric couples and are embedded in the flexible polymer matrix in a way that both ends of each p-type semiconductor leg are exposed to the first surface and the second surface respectively, both ends of each n-type semiconductor leg are exposed to the first surface and the second surface respectively, and the plurality of p-type semiconductor legs and the plurality of n-type semiconductor legs are separated by the flexible polymer matrix; and a plurality of first electrode columns located on the first surface and arranged in parallel with a first axis of bending of the thermoelectric generator, each first electrode column comprising a plurality of first electrodes and a first flexible layer, the plurality of first electrodes being attached on the first flexible layer in at least one column and coupled to their respective thermoelectric couples.

In certain embodiments, the thermoelectric generator described above further comprises: a plurality of second electrode columns located on the second surface and arranged in parallel with a second axis of bending of the thermoelectric generator, each second electrode column comprising a plurality of second electrodes and a second flexible layer, the plurality of second electrodes being attached on the second flexible layer in at least one column and coupled to their respective thermoelectric couples, the second axis of bending being perpendicular to the first axis of bending.

In certain embodiments, the thermoelectric generator described above further comprises: a plurality of second electrodes located on the second surface and coupled to the plurality of thermoelectric couples; and a second flexible layer covering the plurality of second electrodes.

Provided herein is a method for fabricating the thermoelectric generator described above comprising: arranging the plurality of p-type semiconductor legs and the plurality of n-type semiconductor legs in an array; inserting a solution of the flexible polymer matrix among the plurality of p-type semiconductor legs and the plurality of n-type semiconductor legs; curing the solution of the flexible polymer matrix thereby forming the thermoelectric conversion layer; forming the plurality of first electrodes on a first substrate layer, the first substrate layer having the same material and thickness of each first flexible layer; attaching the plurality of first electrodes on the first substrate layer to the first surface of the thermoelectric conversion layer; separating the first substrate layer along the first axis of bending thereby forming the plurality of first electrode columns; forming the plurality of second electrodes on a second substrate layer, the second substrate layer having the same material and thickness of each second flexible layer; attaching the plurality of second electrodes on the second substrate layer to the second surface of the thermoelectric conversion layer; and separating the second substrate layer along the second axis of bending thereby forming the plurality of second electrode columns.

These and other aspects, features and advantages of the present disclosure will become more fully apparent from the following brief description of the drawings, the drawings, the detailed description of certain embodiments and appended claims.

BRIEF DESCRIPTION OF DRAWINGS

The appended drawings contain figures of certain embodiments to further illustrate and clarify the above and other aspects, advantages and features of the present invention. It will be appreciated that these drawings depict embodiments of the invention and are not intended to limit its scope. The invention will be described and explained with additional specificity and detail through the use of the accompanying drawings in which.

DETAILED DESCRIPTION OF THE INVENTION

The present disclosure provides a thermoelectric generator and methods for fabricating the same. The thermoelectric generator comprises semiconductor legs and electrodes embedded in one or more flexible polymer matrices, which fix the position of the semiconductor legs and electrodes and provide protection to them to maintain good electric contacts among them during bending. Thus, the thermoelectric generator is flexible and its output power can be substantially retained even after a large number of bending cycles. Besides the protection during bending, the one or more flexible polymer matrices can also reduce the degradation of semiconductor legs and electrodes by avoiding oxidation in air.

Two different flexible polymer matrices having different thermal conductivities can be used. A first flexible polymer matrix between the semiconductor legs has lower thermal conductivity to reduce heat conduction from a hot side to a cold side via the first flexible polymer matrix such that the heat conduction is substantially remained within the semiconductor legs. In contrast, a second flexible polymer matrix covering the electrodes on both sides of the thermoelectric generator has higher thermal conductivity to increase heat conduction between the surfaces of the thermoelectric generator and the electrodes from a hot side to a cold side via the second flexible polymer matrix, thereby improving the response time and the power output of the thermoelectric generator.

Figure 1:
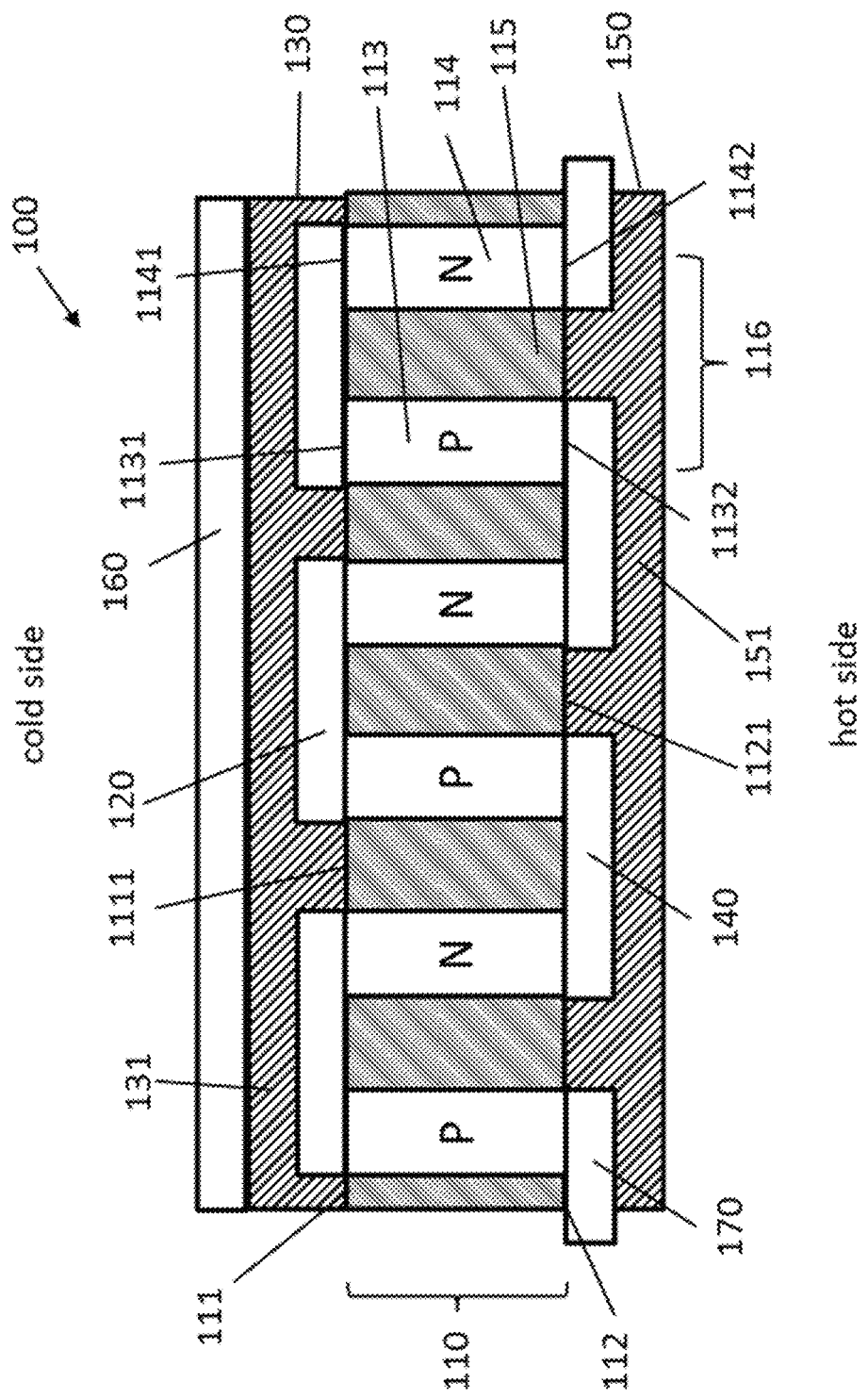
FIG. 1 is a schematic diagram depicting the cross section of a thermoelectric generator according to certain embodiments.

FIG. 1 is a schematic diagram depicting the cross section of a thermoelectric generator according to certain embodiments. The thermoelectric generator 100 comprises a thermoelectric conversion layer 110, a plurality of first electrodes 120, a first flexible layer 130, a plurality of second electrodes 140 and a second flexible layer 150.

The thermoelectric conversion layer 110 has a first surface 111 and a second surface 112 and comprises a plurality of p-type semiconductor legs 113, a plurality of n-type semiconductor legs 114, and a first flexible polymer matrix 115 having a first thermal conductivity. The first surface 111 is opposite to the second surface 112. The plurality of p-type semiconductor legs 113 and the plurality of n-type semiconductor legs 114 define a plurality of thermoelectric couples 116 and are embedded in the first flexible polymer matrix 115 in a way that both ends 1131, 1132 of each p-type semiconductor leg 113 are exposed to the first surface 111 and the second surface 112 respectively, both ends 1141, 1142 of each n-type semiconductor leg 114 are exposed to the first surface 111 and the second surface 112 respectively, and the plurality of p-type semiconductor legs 113 and the plurality of n-type semiconductor legs 114 are separated by the first flexible polymer matrix 115.

The plurality of first electrodes 120 is located on the first surface 111 and coupled to the plurality of thermoelectric couples 116. In this embodiment, each first electrode 120 connects the end 1131 of its respective p-type semiconductor leg 113 and the end 1141 of its respective n-type semiconductor leg 114 on the first surface 112.

The first flexible layer 130 comprises a second flexible polymer matrix 131 having a second thermal conductivity and covers the plurality of first electrodes 120 and an exposed area 1111 of the first surface 111, and the exposed area 1111 is an area not covered by the plurality of first electrodes 120, such that the first surface 111 is fully covered by the plurality of first electrodes 120 and the second flexible polymer matrix 131. As no void is present between the first flexible layer 130 and the thermoelectric conversion layer 110 and the plurality of first electrodes 120 is fully embedded by the first polymer matrix 115 and the second polymer matrix 131, the mechanical stability of the connection between the first electrode 120 and its respective p-type and n-type semiconductor legs 113, 114 is enhanced. In addition, as the second flexible polymer matrix 131 is completely filled between the first electrodes 120, the thermal conduction between the surface of the thermoelectric generator 100 and the plurality of first electrodes 120 is also improved.

The plurality of second electrodes 140 is located on the second surface 112 and coupled to the plurality of thermoelectric couples 116. In this embodiment, each second electrode 140 connects the end 1132 of its respective p-type semiconductor legs 113 and the end 1142 of its respective n-type semiconductor legs 114 on the second surface 112.

The second flexible layer 150 comprises a third flexible polymer matrix 151 having a third thermal conductivity and covers the plurality of second electrodes 140 and an exposed area 1121 of the second surface 112, and the exposed area 1121 of the second surface 112 is an area not covered by the plurality of second electrodes 140, such that the second surface 112 is fully covered by the plurality of second electrodes 140 and the third flexible polymer matrix 151. As no void is present between the second flexible layer 150 and the thermoelectric conversion layer 110 and the plurality of second electrodes 140 is fully embedded by the first polymer matrix 115 and the third polymer matrix 151, the mechanical stability of the connection between the second electrode 140 and its respective p-type and n-type semiconductor legs 113, 114 is enhanced. In addition, as the third flexible polymer matrix 151 is completely filled between the second electrodes 140, the thermal conduction between the surface of the thermoelectric generator 100 and the plurality of second electrodes 140 is also improved.

In this embodiment, the thermoelectric generator 100 further comprises a heat dissipation layer 160 located on the first flexible layer 130 at cold side.

In this embodiment, the thermoelectric generator 100 further comprises two electrical terminal contacts 170 for connecting a p-type semiconductor leg and a n-type semiconductor leg at both ends respectively for connecting the thermoelectric generator 100 to a load.

The semiconductor legs and the first electrodes are embedded in the first polymer matrix and the second polymer matrix, which fix the position of the semiconductor legs and the first electrodes and provide protection to them to maintain good electric contacts among them during bending. The semiconductor legs and the second electrodes are embedded in the first polymer matrix and the third polymer matrix, which fix the position of the semiconductor legs and the second electrodes and provide protection to them to maintain good electric contacts among them during bending.

Thus, the output power of the flexible thermoelectric generator can be substantially retained even after a large number of bending cycles.

The flexible heat dissipation layer can maintain the temperature difference over the thermoelectric generator for a long time and improve the continuous power output.

In certain embodiments, the first flexible polymer matrix, the second flexible polymer matrix and the third flexible polymer matrix are the same.

In certain embodiments, the first flexible polymer matrix is different from the second flexible polymer matrix and the third flexible polymer matrix, and the second flexible polymer matrix and the third flexible polymer matrix are the same.

In certain embodiments, the first flexible polymer matrix is different from the second flexible polymer matrix and the third flexible polymer matrix, and the second thermal conductivity and the third thermal conductivity are higher than the first thermal conductivity. The first flexible polymer matrix between the semiconductor legs has lower thermal conductivity to reduce heat conduction from a hot side to a cold side such that the heat conduction is substantially remained within the semiconductor legs for improving the power output. In contrast, the second polymer matrix and the third flexible polymer matrix have higher thermal conductivity to improve heat conduction between the surface of first flexible layer and the first electrodes and between the surface of the second flexible layer and the second electrodes from a hot side to a cold side, thereby improving the response time and the power output of the thermoelectric generator.

In certain embodiments, the first thermal conductivity of the first flexible polymer matrix is between 0.1 W/mK and 0.5 W/mK, between 0.2 W/mK and 0.4 W/mK, or between 0.25 W/mK and 0.35 W/mK.

In certain embodiments, the second thermal conductivity of the second flexible polymer matrix is between 0.5 W/mK and 3.0 W/mK, between 1.0 W/mK and 2.5 W/mK, or between 1.5 W/mK and 2.0 W/mK.

In certain embodiments, the third thermal conductivity of the third flexible polymer matrix is between 0.5 W/mK and 3 W/mK, between 1.0 W/mK and 2.5 W/mK, or between 1.5 W/mK and 2.0 W/mK.

In certain embodiments, the first flexible polymer matrix has a porous structure for decreasing its first thermal conductivity.

In certain embodiments, the first flexible polymer matrix has a composition comprising a polymer. The polymer can be polydimethylsiloxane (PDMS), thermoplastic polyurethane (TPU), or ethylene-vinyl acetate copolymer (EVA).

In certain embodiments, the second flexible polymer matrix has a composition comprising a polymer. The polymer can be PDMS, TPU, EVA, or polyimide (PI).

In certain embodiments, the second flexible polymer matrix has a composition comprising a polymer and one or more fillers. The polymer can be PDMS, TPU, EVA or PI, and the one or more fillers can be silicon carbide (SiC), boron nitride (BN), aluminum oxide ($Al_2O_3$), aluminum nitride (AlN), graphite, a carbon nanotube (CNT), or a combination thereof. The one or more fillers can increase the second thermal conductivity of the second flexible polymer matrix.

In certain embodiments, the third flexible polymer matrix has a composition comprising a polymer. The polymer can be PDMS, TPU, EVA, or PI.

In certain embodiments, the third flexible polymer matrix has a composition comprising a polymer and one or more fillers. The polymer can be PDMS, TPU, EVA or PI, and the one or more fillers can be SiC, BN, $Al_2O_3$, AlN, graphite, CNT, or a combination thereof. The one or more fillers can increase the third thermal conductivity of the third flexible polymer matrix.

In certain embodiments, the first flexible layer has a thickness between 2.0 mm and 1.0 mm, between 1.8 mm and 1.2 mm, or between 1.6 mm and 1.4 mm.

In certain embodiments, the second flexible layer has a thickness between 2.0 mm and 1.0 mm, between 1.8 mm and 1.2 mm, or between 1.6 mm and 1.4 mm.

In certain embodiments, the thermoelectric generator has an area between 900 $cm^2$ and 1 $cm^2$, between 100 $cm^2$ and 1 $cm^2$, or between 10 $cm^2$ and 1 $cm^2$. In certain embodiments, the thermoelectric generator has a width between 30 cm and 1 cm, between 10 cm and 1 cm, or between 3 cm and 1 cm. In certain embodiments, the thermoelectric generator has a length between 30 cm and 1 cm, between 10 cm and 1 cm, or between 3 cm and 1 cm. In certain embodiments, the thermoelectric generator has a thickness between 2 cm and 0.3 cm, between 1.0 cm and 0.3 cm, or between 0.6 cm and 0.3 cm.

In certain embodiments, the thermoelectric generator has a thickness between 4.0 mm and 4.5 mm, the first flexible layer has a thickness between 1.5 mm and 1.0 mm, and the second flexible layer has a thickness between 1.5 mm and 1.0 mm.

In certain embodiments, the thermoelectric generator has a number of the semiconductor legs per $cm^2$ between 32 and 4, between 28 and 8, or between 24 and 12.

In certain embodiments, the p-type semiconductor leg comprises bismuth telluride ($Bi_2Te_3$), bismuth selenide ($Bi_2Se_3$), antimony telluride ($Sb_2Te_3$), $(Bi,Sb)_2Te_3$, iron antimonide ($FeSb_2$), lead telluride (PbTe), tin selenide (SnSe), or bismuth antimonide (BiSb).

In certain embodiments, the p-type semiconductor leg is cylindrical, rectangular, cubic, or hexagonal.

In certain embodiments, the p-type semiconductor leg has a length between 3 mm and 1 mm, between 2 mm and 1 mm, or between 1.5 mm and 1 mm. In certain embodiments, the p-type semiconductor leg has a width between 3 mm and 1 mm, between 2 mm and 1 mm, or between 1.5 mm and 1 mm. In certain embodiments, the p-type semiconductor leg has a thickness between 3 mm and 1 mm, between 2.5 mm and 1.5 mm, or between 2.2 mm and 1.8 mm.

In certain embodiments, the n-type semiconductor leg comprises $Bi_2Te_3$, $Bi_2Se_3$, $Sb_2Te_3$, $(Bi,Sb)_2Te_3$, $FeSb_2$, PbTe, SnSe, or BiSb.

In certain embodiments, the n-type semiconductor leg is cylindrical, rectangular, cubic, or hexagonal.

In certain embodiments, the n-type semiconductor leg has a length between 3 mm and 1 mm, between 2 mm and 1 mm, or between 1.5 mm and 1 mm. In certain embodiments, the n-type semiconductor leg has a width between 3 mm and 1 mm, between 2 mm and 1 mm, or between 1.5 mm and 1 mm. In certain embodiments, the n-type semiconductor leg has a thickness between 3 mm and 1 mm, between 2.5 mm and 1.5 mm, or between 2.2 mm and 1.8 mm.

In certain embodiments, the spacing between two semiconductor legs is between 10 mm and 0.4 mm, between 8 mm and 0.4 mm, or between 6 mm and 0.4 mm.

In certain embodiments, the first electrode comprises copper (Cu), silver (Ag), gallium-indium eutectic (EGaIn), or a conductive fabric.

In certain embodiments, the first electrode has a length between 6 mm and 1 mm, between 5 mm and 2 mm, or between 4 mm and 3 mm. In certain embodiments, the first electrode has a width between 6 mm and 1 mm, between 5 mm and 2 mm, or between 4 mm and 3 mm. In certain embodiments, the first electrode has a thickness between 1 mm and 0.1 mm, between 0.8 mm and 0.3 mm, or between 0.6 mm and 0.5 mm.

In certain embodiments, the first electrode is flexible for increasing the flexibility of the thermoelectric generator. In certain embodiments, the contact resistance between the first electrode and the semiconductor leg is minimized by a surface treatment or a bonding layer.

In certain embodiments, the second electrode comprises copper (Cu), silver (Ag), gallium-indium eutectic (EGaIn), or a conductive fabric.

In certain embodiments, the second electrode has a length between 6 mm and 1 mm, between 5 mm and 2 mm, or between 4 mm and 3 mm. In certain embodiments, the second electrode has a width between 6 mm and 1 mm, between 5 mm and 2 mm, or between 4 mm and 3 mm. In certain embodiments, the second electrode has a thickness between 1 mm and 0.1 mm, between 0.8 mm and 0.3 mm, or between 0.6 mm and 0.5 mm.

In certain embodiments, the second electrode is flexible for increasing the flexibility of the thermoelectric generator. In certain embodiments, the contact resistance between the second electrode and the semiconductor leg is minimized by a surface treatment or a bonding layer.

In certain embodiments, the flexible heat dissipation layer comprises a super absorption polymer, a cooling fabric, a water absorption paper, a phase change material, a metal foam, or a thermal conductive glue. In certain embodiments, the flexible heat dissipation layer comprises a metal foam filled with a phase change material.

Figure 2:
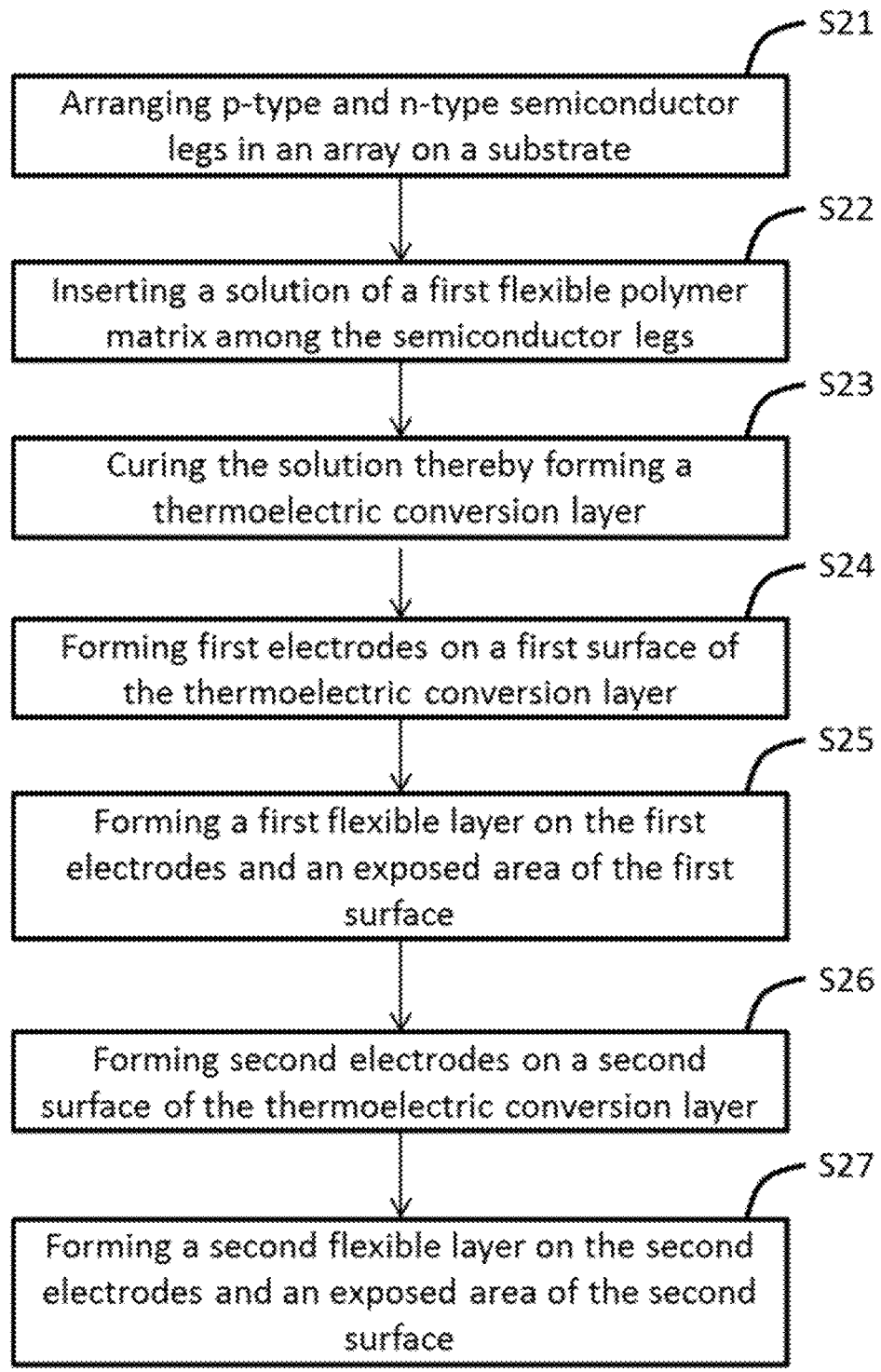
FIG. 2 is a flow chart depicting a method for fabricating a thermoelectric generator according to certain embodiments.

FIG. 2 is a flow chart depicting a method for fabricating a thermoelectric generator according to certain embodiments. In step S21, p-type and n-type semiconductor legs are arranged in an array on a substrate. In step S22, a solution of a first flexible polymer matrix is inserted among the p-type and n-type semiconductor legs. In step S23, the solution of the first flexible polymer matrix is cured thereby forming a thermoelectric conversion layer. In step S24, first electrodes are formed on a first surface of the thermoelectric conversion layer to connect their respective p-type and n-type semiconductor legs. In step S25, a first flexible layer is formed on the first electrodes and an exposed area of the first surface. In step S26, second electrodes are formed on a second surface of the thermoelectric conversion layer to connect their respective p-type and n-type semiconductor legs. In step S27, a second flexible layer is formed on the second electrodes and an exposed area of the second surface.

As the p-type and n-type semiconductor legs are firstly arranged and fixed by the first polymer matrix in the thermoelectric conversion layer, the first electrodes and the first flexible layer as well as the second electrodes and the second flexible layer can be easily formed on both sides of the thermoelectric generator, thereby simplifying the fabrication process.

In certain embodiments, the p-type and n-type semiconductor legs are arranged in an array on a substrate by a pick and place method.

In certain embodiments, the first electrodes and the second electrodes are formed by a dispensing method, a printing method, a pick and place method, or a soldering method.

Figure 3:
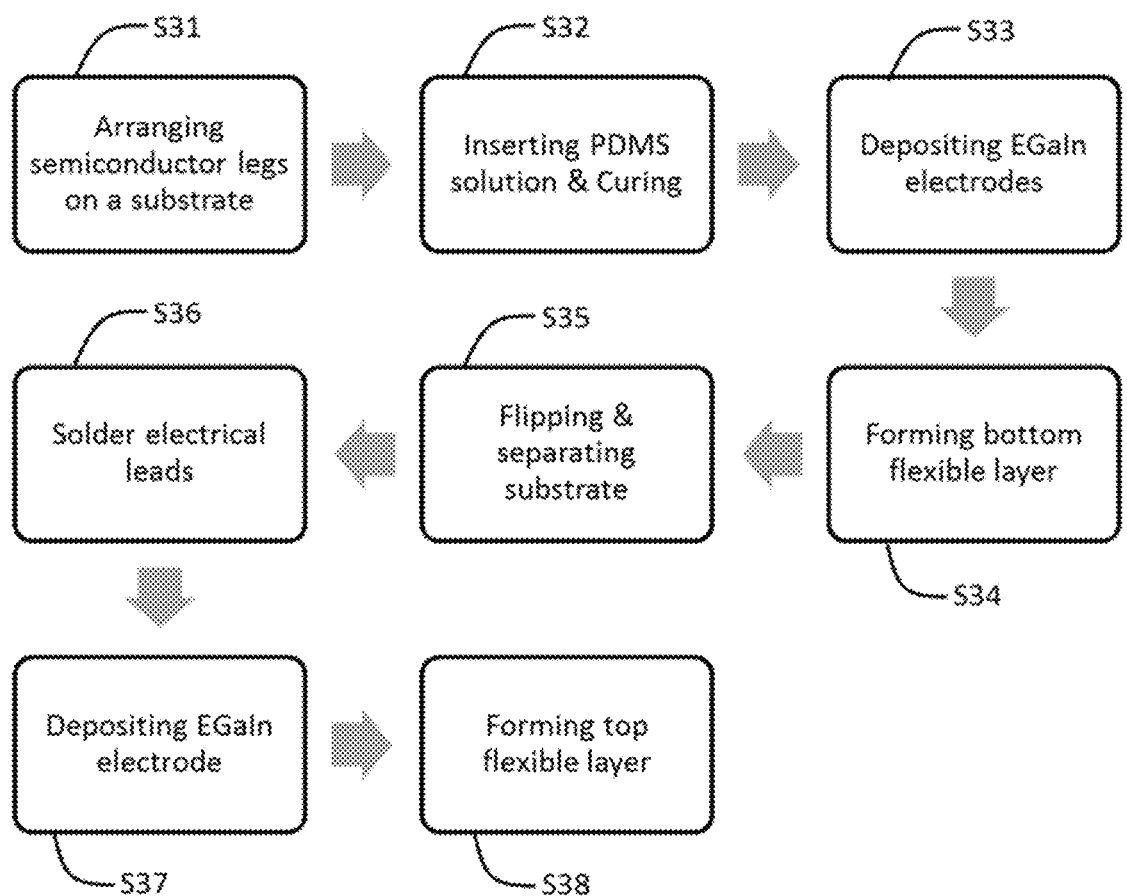
FIG. 3 is a flow chart depicting a method for fabricating a thermoelectric generator according to certain embodiments.

FIG. 3 is a flow chart depicting a method for fabricating a thermoelectric generator according to certain embodiments. In step S31, p-type and n-type semiconductor legs are arranged in an array on a substrate. In step S32, a PDMS solution is inserted among the p-type and n-type semiconductor legs and cured to form a thermoelectric conversion layer. In step S33, EGaIn electrodes are deposited on the prewet bottom surface of the thermoelectric conversion layer. In step S34, a PDMS solution with fillers is placed and cured on the EGaIn electrodes and the exposed area of the bottom surface to cover them with a bottom flexible layer. In step S35, the substrate is flipped and separated from the thermoelectric conversion layer. In step S36, electrical leads are soldered to a p-type and a n-type semiconductor legs at both ends. In step S37, EGaIn electrodes are deposited on the prewet top surface of the thermoelectric conversion layer. In step S38, a PDMS solution with fillers is placed and cured on the EGaIn electrodes and the exposed area of the top surface to cover them with a top flexible layer.

Figure 4A:
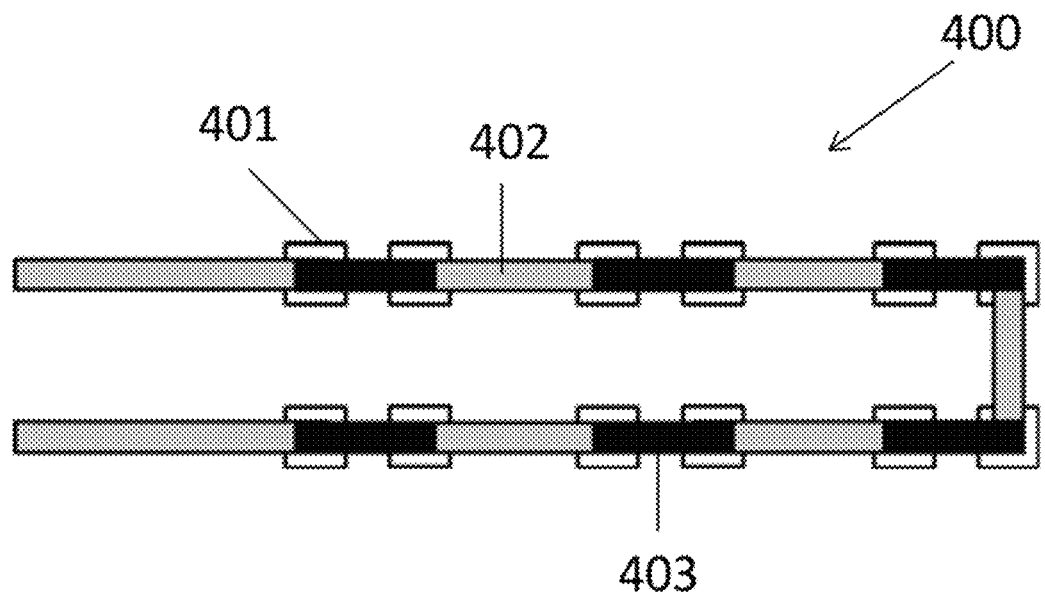
FIG. 4A is a schematic diagram depicting a first layout of semiconductor legs in a flexible thermoelectric generator according to certain embodiments.

FIG. 4A is a schematic diagram depicting a first layout of semiconductor legs in a flexible thermoelectric generator according to certain embodiments. For the first layout 400, semiconductor legs 401 are connected by top electrodes 402 and bottom electrodes 403 in series. The rows of the semiconductor legs 401 connected in series are connected in parallel that increases the packing density of the semiconductor legs, thereby providing higher output power.

Figure 4B:
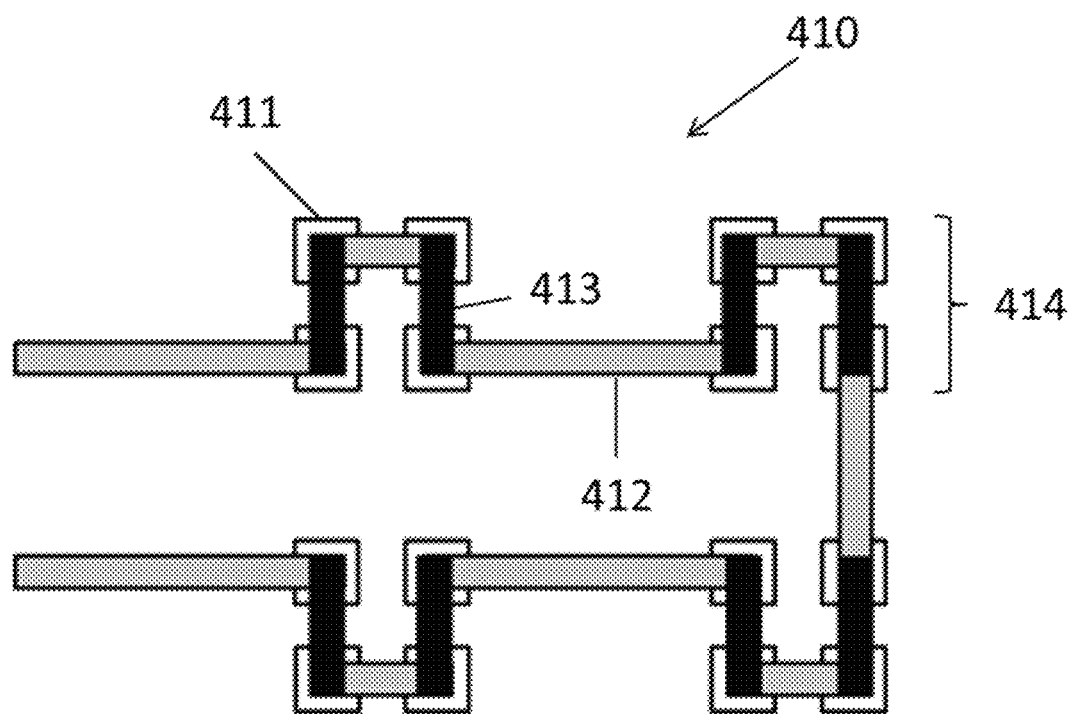
FIG. 4B is a schematic diagram depicting a second layout of semiconductor legs in a flexible thermoelectric generator according to certain embodiments.

FIG. 4B is a schematic diagram depicting a second layout of semiconductor legs in a flexible thermoelectric generator according to certain embodiments. The second layout 410 comprises a plurality of sub-arrays 414. Each sub-array 414 has a plurality of semiconductor legs 411. In this embodiment, the sub-array has 4 semiconductor legs 411. Each semiconductor leg 411 is connected to a top electrode 412 and a bottom electrode 413. The spacing between two sub-arrays 414 is larger than the spacing between two semiconductor legs 411 within the sub-array 414. As the semiconductor legs 411 in the sub-array 414 are tightly packed, this arrangement provides higher output power. On the other hand, as the sub-arrays 414 are located relatively far away between each other, the flexibility of the flexible thermoelectric generator can be increased. In certain embodiments, the spacing between two sub-array is larger than the spacing between two semiconductor legs in a sub-array by 2-5 times such that a balance between high power output and good flexibility is achieved.

Figure 5:
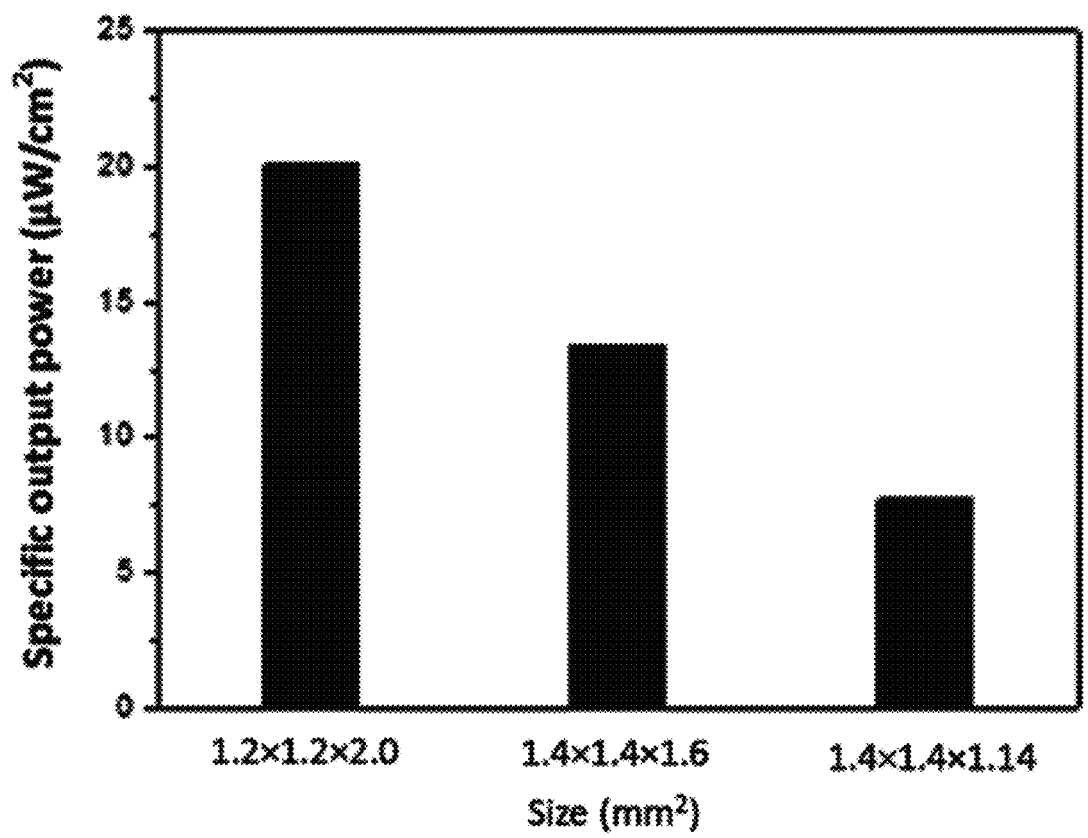
FIG. 5 is a plot showing specific output power of flexible thermoelectric generators (FTEGs) fabricated with different sizes of semiconductor legs according to certain embodiments.

FIG. 5 is a plot showing specific output power of flexible thermoelectric generators fabricated with different sizes of semiconductor legs according to certain embodiments. $Bi_2Te_3$ semiconductor legs with sizes of $1.2 \times 1.2 \times 2.0$ mm$^3$, $1.4 \times 1.4 \times 1.6$ mm$^3$ and $1.4 \times 1.4 \times 1.14$ mm$^3$ were used to fabricate the flexible thermoelectric generators and their specific output power was measured respectively. For semiconductor legs with $1.2 \times 1.2 \times 2.0$ mm$^3$, the total generator thickness was 4 mm. As shown in the plot, the $Bi_2Te_3$ semiconductor legs with sizes of $1.2 \times 1.2 \times 2.0$ mm$^3$, $1.4 \times 1.4 \times 1.6$ mm$^3$ and $1.4 \times 1.4 \times 1.4$ mm$^3$ provide 20 µW/cm$^2$, 13 µW/cm$^2$ and 7 µW/cm$^2$ respectively. It demonstrates that the $Bi_2Te_3$ semiconductor leg with the size of $1.2 \times 1.2 \times 2.0$ mm$^3$ provides the best specific output power among them.

Figure 6:
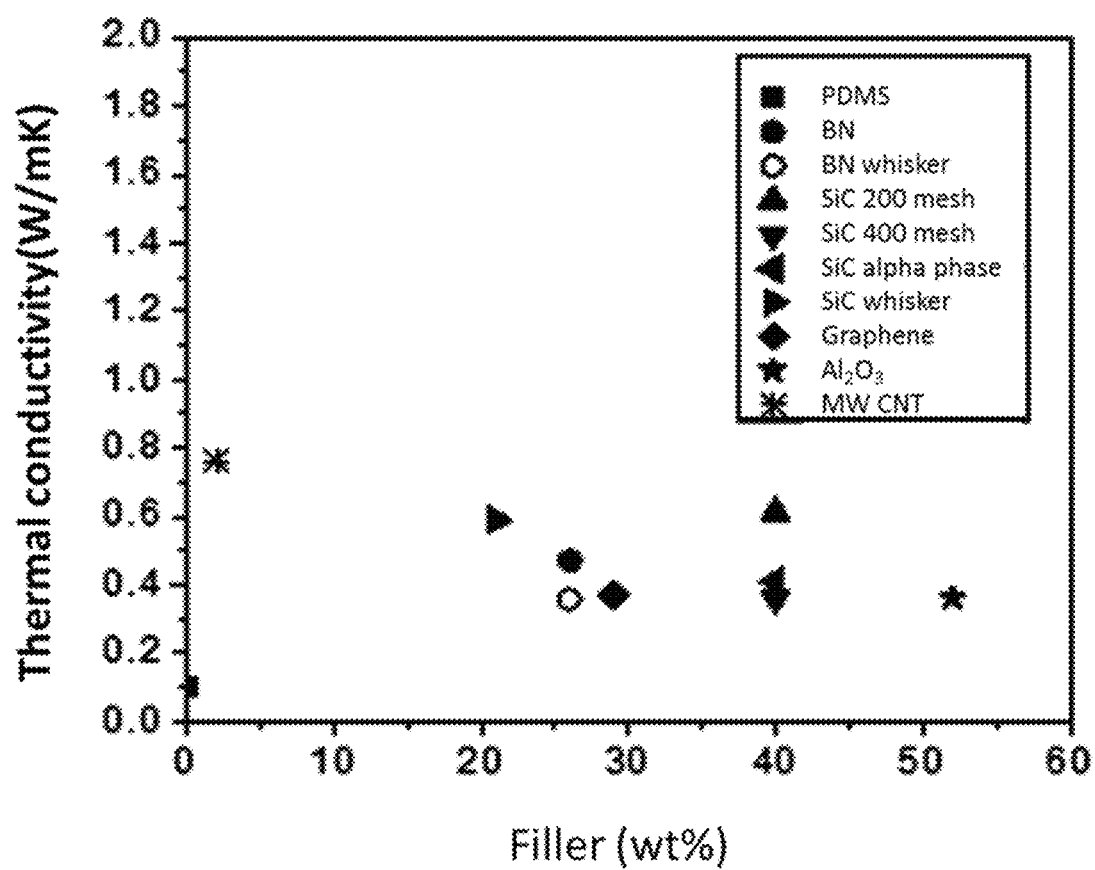
FIG. 6 is a plot showing thermal conductivity of pure PDMS and PDMS with different fillers according to certain embodiments.

Table 1 shows thermal conductivity with pure PDMS and PDMS with different fillers according to certain embodiments. The results are also plotted in FIG. 6.

TABLE 1

| Material (PDMS + single filler) | Thermal conductivity (W/mK) |
|---|---|
| Pure PDMS | 0.10 |
| PDMS + 28% BN | 0.50 |
| PDMS + 26% BN | 0.46 |
| PDMS + 59% SiC (200 mesh) | 0.64 |
| PDMS + 40% SiC (400 mesh) | 0.33 |

TABLE 1-continued

| Material (PDMS + single filler) | Thermal conductivity (W/mK) |
|---|---|
| PDMS + 40% SiC (alpha phase) | 0.38 |
| PDMS + 29% Graphite | 0.32 |
| PDMS + 52% Al2O3 | 0.33 |
| PDMS + 2% MWCNT | 0.73 |
| PDMS + 21% SiC whisker | 0.63 |

Table 2 shows thermal conductivity with different samples of flexible polymer matrices with different compositions according to certain embodiments. The samples were prepared by mixing a filler 1 and a filler 2 with PDMS under different wt %.

TABLE 2

| Sample | Filler 1 | Filler 2 | Filler 1 wt % | Filler 2 wt % | Thermal conductivity (W/mK) |
|---|---|---|---|---|---|
| PDMS-BN(1)16-AlNT(1)24 | BN 1 μm | AlN-T 1 μm | 16 | 24 | 1.12 |
| PDMS-BN(1)4-AlNT(5)35 | BN 1 μm | AlN-T 5 μm | 4 | 35 | 1.18 |
| PDMS-BN(1)4-AlNT(20)35 | BN 1 μm | AlN-T 20 μm | 4 | 35 | 1.16 |
| PDMS-16BN(5)-14SiC | BN 5 μm | SiC 200 mesh | 16 | 14 | 1.05 |
| PDMS-AlNT(1)12-AlO31 | AlN-T 1 μm | Al₂O₃ | 12 | 31 | 1.13 |

As shown in Table 2, the samples have relatively high thermal conductivity (~1 W/mK) and acceptable viscosity. Comparing with the results of Table 1 and Table 2, the thermal conductivity of flexible polymer matrices with two fillers is higher than that with single filler.

Figure 7:
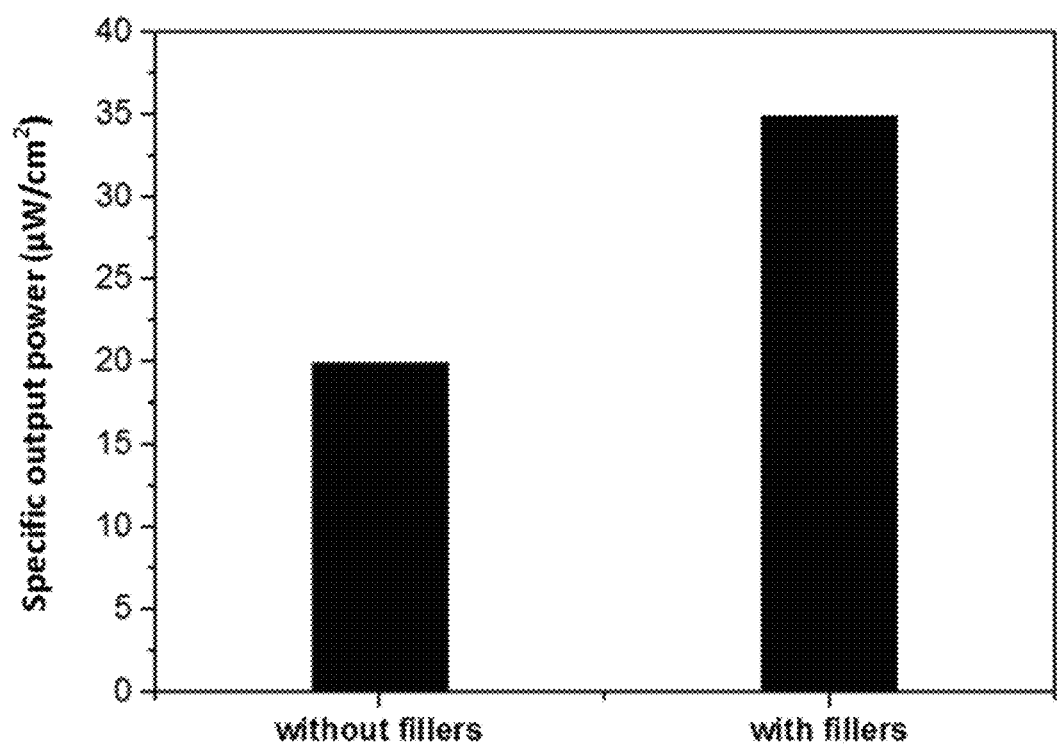
FIG. 7 is a plot showing specific output power of flexible thermoelectric generators fabricated with pure PDMS and PDMS with fillers according to certain embodiments.

FIG. 7 is a plot showing specific output power of flexible thermoelectric generators fabricated with pure PDMS and PDMS with fillers according to certain embodiments. The size of the semiconductor legs used herein was 1.2×1.2×2.0 mm³ and total thickness of the generator was 4 mm. As shown in FIG. 7, the flexible thermoelectric generator fabricated with the above sample of PDMS-BN(1)16-AlNT(1)24 provides specific output power with 35 μW/cm² while the flexible thermoelectric generator fabricated with pure PDMS provides specific output power with 20 μW/cm². It demonstrates that there is 40% increase in the specific output power when the fillers are added in PDMS. The fillers have greatly improved the heat conduction from surfaces of the generator to the semiconductor legs.

Figure 8:
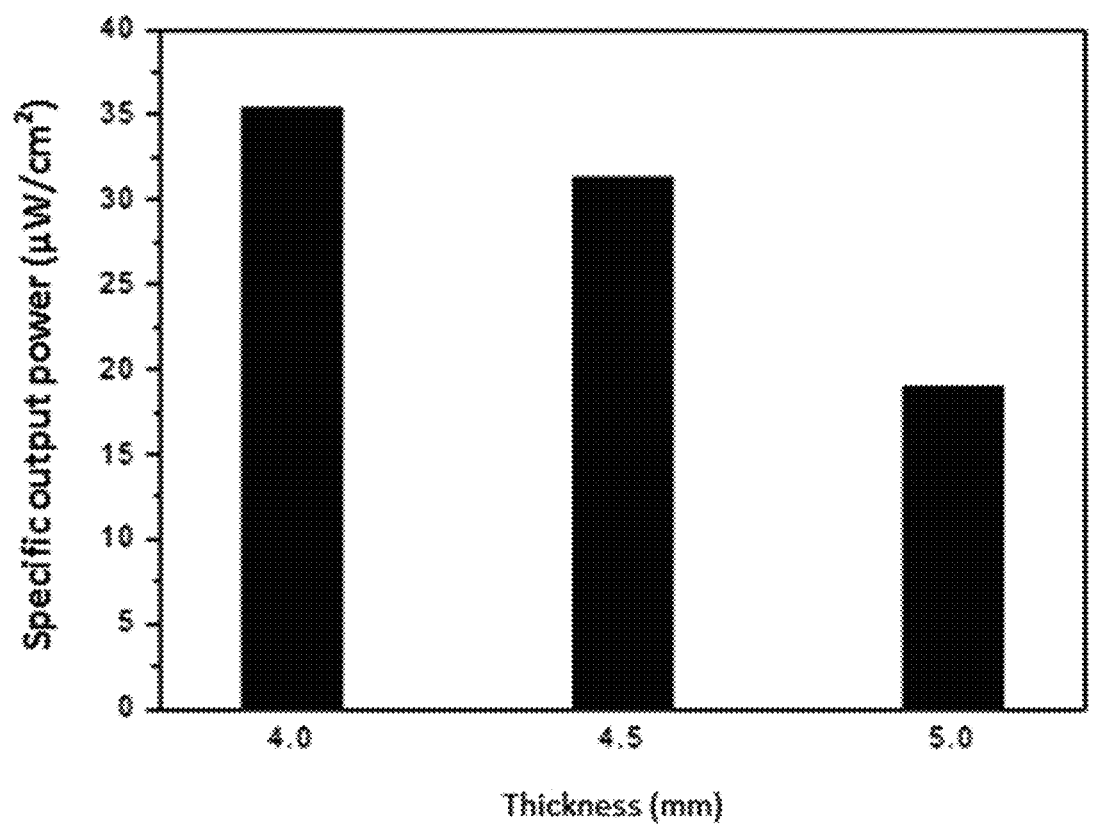
FIG. 8 is a plot showing specific output power of flexible thermoelectric generators fabricated with various thickness according to certain embodiments.

FIG. 8 is a plot showing specific output power of flexible thermoelectric generators fabricated with various thicknesses according to certain embodiments. The semiconductor legs of 1.2×1.2×2.0 mm³ and the above sample of PDMS-BN(1)16-AlNT(1)24 were used to fabricate the thermoelectric generators with thickness of 4.0 mm, 4.5 mm and 5.0 mm. As shown in FIG. 8, the thermoelectric generators with thickness of 4.0 mm, 4.5 mm and 5.0 mm provides specific output power of 35 μW/cm², 32 μW/cm² and 19 μW/cm² respectively. It demonstrates that the thinner flexible layer can provide higher output power. Thinner thickness of the flexible layer is favorable for heat conduction from the generator surface to the semiconductor legs.

When the flexible thermoelectric generator works for long time, temperature difference between two sides will gradually decrease and the power generation will also decrease. Thus, a flexible heat dissipation layer can be attached on the cold side of the flexible thermoelectric generator for facilitating heat release.

Figure 9A:
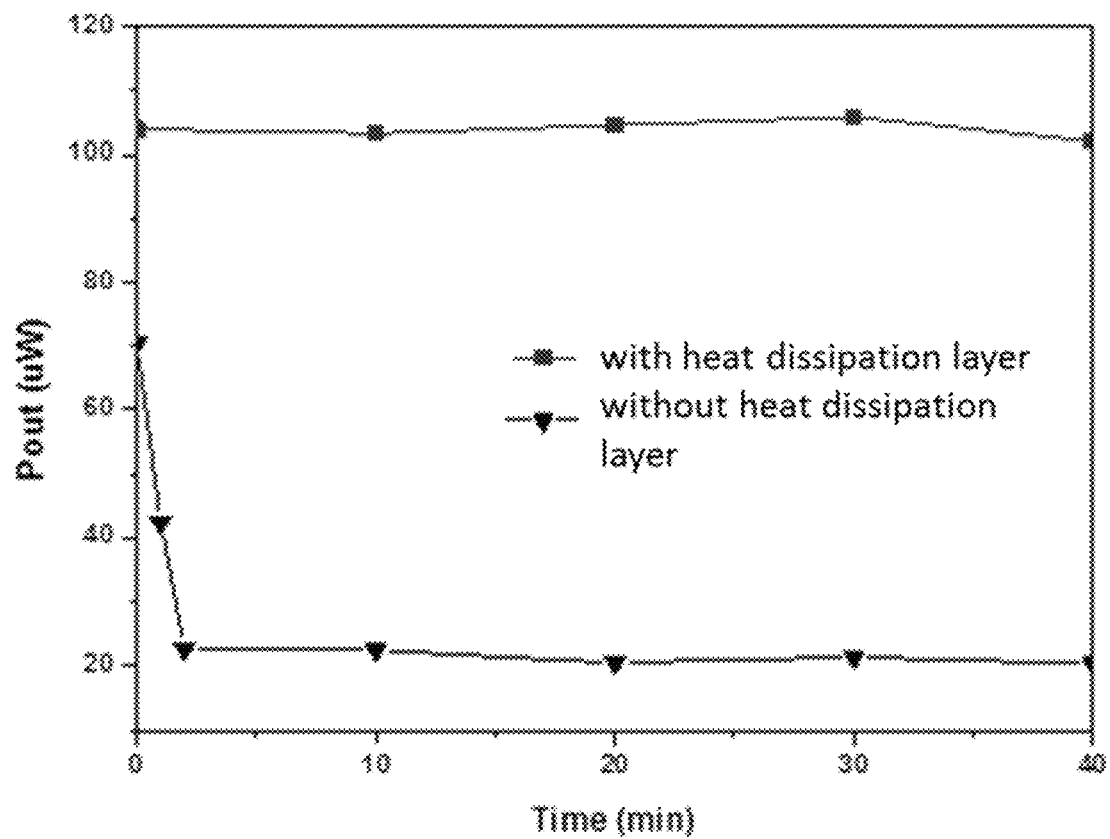
FIG. 9A is a plot showing output power of flexible thermoelectric generators fabricated with a flexible heat dissipation layer and without a flexible heat dissipation layer according to certain embodiments.

FIG. 9A is a plot showing output power of flexible thermoelectric generators fabricated with a flexible heat dissipation layer and without a flexible heat dissipation layer according to certain embodiments. The flexible heat dissipation layer used herein was a water absorption paper. As shown in FIG. 9A, there is no drop in the output power (about 105 μW) of the flexible thermoelectric generator with the flexible heat dissipation layer while the output power is dropped from 70 μW to 20 μW for the flexible thermoelectric generator without the flexible heat dissipation layer.

Example 1

A FTEG sample was fabricated as follows. Bi₂Te₃ semiconductor legs with a size of 1.2×1.2×2.0 mm³ were used for both p-type and n-type. The semiconductor leg spacing of the sample was between 0.5-0.7 mm. 40 semiconductor legs in row and 12 semiconductor legs in column were arranged to provide 480 semiconductor legs. An effective area of the sample was 67.5×22.1 mm² (i.e., 14.9 cm²). The electrode of the sample was GaIn eutectic. The polymer between the semiconductor legs was PDMS. The Polymer layer on top of the electrode was PDMS modified by adding BN (1 μm particle size, 16% wt)+AlN (1 μm particle size, 24% wt). The sample had an internal resistance of 12.0 ohm and a thickness of 4.06 mm.

The testing results of the FTEG sample are shown in Table 3A.

TABLE 3A

| Delta Temperature (T) °C. | Open circuit voltage (OCV) mV | Output voltage ($U_{out}$) mV | Output power ($P_{out}$) μW | Specific output power ($P_{out}$) μWcm⁻² |
|---|---|---|---|---|
| 1 | 33.7 | 15.7 | 24.4 | 1.6 |
| 2 | 64.8 | 30.5 | 92.1 | 6.2 |
| 3 | 94.5 | 47.1 | 219.6 | 14.7 |
| 4 | 127.4 | 59.4 | 349.3 | 23.4 |
| 5 | 159.7 | 73 | 527.6 | 35.4 |

As shown in Table 3A, the sample provides an output power of 0.53 mW when delta T is 5° C.

Another control FTEG sample was fabricated in the same way as above but pure PDMS was used for all polymer layers. The testing results are shown in Table 3B.

TABLE 3B

| Delta Temperature (T) °C. | Open circuit voltage (OCV) mV | Output voltage ($U_{out}$) mV | Output power ($P_{out}$) μW | Specific output power ($P_{out}$) μWcm⁻² |
|---|---|---|---|---|
| 1 | 23.8 | 11.0 | 12.0 | 0.8 |
| 2 | 47.6 | 22.0 | 47.9 | 3.2 |
| 3 | 71.4 | 33.0 | 107.8 | 7.2 |
| 4 | 95.2 | 44.0 | 191.7 | 12.9 |
| 5 | 119.0 | 55.0 | 299.5 | 20.1 |

As shown in Table 3B, the sample provides an output power of 0.30 mW when delta T is 5° C. By comparing the results of Table 3A and Table 3B, it demonstrates that the output power is substantially increased when the PDMS on top of the electrodes is modified with fillers, which increase the thermal conductivity of the polymer layer, thus improving the heat conduction from the surfaces of the generator to the semiconductor legs.

Example 2

A bending test was conducted to study the output power of a thermoelectric generator before bending and after 1000 bending cycles. A FTEG sample was fabricated as follows. $Bi_2Te_3$ semiconductor legs with a size of 1.2×1.2×2.0 $mm^3$ were used for both p-type and n-type. The semiconductor leg spacing of the sample was between 0.5 and 0.7 mm. 40 semiconductor legs in row and 12 semiconductor legs in column were arranged to provide 480 semiconductor legs. An effective area of the sample was 67.5×22.1 $mm^2$ (i.e., 14.9 $cm^2$). The electrode of the sample was GaIn eutectic. The polymer between the semiconductor legs was PDMS. The Polymer layer on top of the electrode was PDMS modified by adding BN (1 μm particle size, 16% wt)+AlN (1 μm particle size, 24% wt). The sample had an internal resistance of 11.1 ohm and a thickness of 4.06 mm.

The testing results of the FTEG sample before bending are shown in Table 4A.

TABLE 4A

| Delta Temperature (T) ° C. | Open circuit voltage (OCV) mV | Output voltage ($U_{out}$) mV | Output power ($P_{out}$) μW | Specific output power ($P_{out}$) μWcm$^{-2}$ |
| --- | --- | --- | --- | --- |
| 1 | 25.8 | 13.3 | 17.5 | 1.2 |
| 2 | 52.0 | 24.9 | 61.4 | 4.1 |
| 3 | 75.2 | 36.4 | 131.2 | 8.8 |
| 4 | 100.6 | 48.5 | 232.9 | 15.6 |
| 5 | 124.8 | 59.5 | 350.5 | 23.5 |

The testing results of the FTEG sample after 1000 bending cycles are shown in Table 4B.

TABLE 4B

| Delta Temperature (T) ° C. | Open circuit voltage (OCV) mV | Output voltage ($U_{out}$) mV | Output power ($P_{out}$) μW | Specific output power ($P_{out}$) μWcm$^{-2}$ |
| --- | --- | --- | --- | --- |
| 1 |  | 11.8 | 13.8 | 0.9 |
| 2 | 48.8 | 22.6 | 50.6 | 3.4 |
| 3 | 71.5 | 32.3 | 103.3 | 6.9 |
| 4 | 91.2 | 43.3 | 185.6 | 12.5 |
| 5 | 118.7 | 54.2 | 290.9 | 19.5 |

As shown in Tables 4A and 4B, the sample provides output power of 0.35 mW when delta T is 5° C. before bending and an output power of 0.29 mW when delta T is 5° C. after 1000 bending cycles. Accordingly, even after 1000 bending cycles, the sample can still operate with retention of 83% of its initial output power. It demonstrates that the FTEG sample has high flexibility and reliability.

Example 3

Figure 9B:
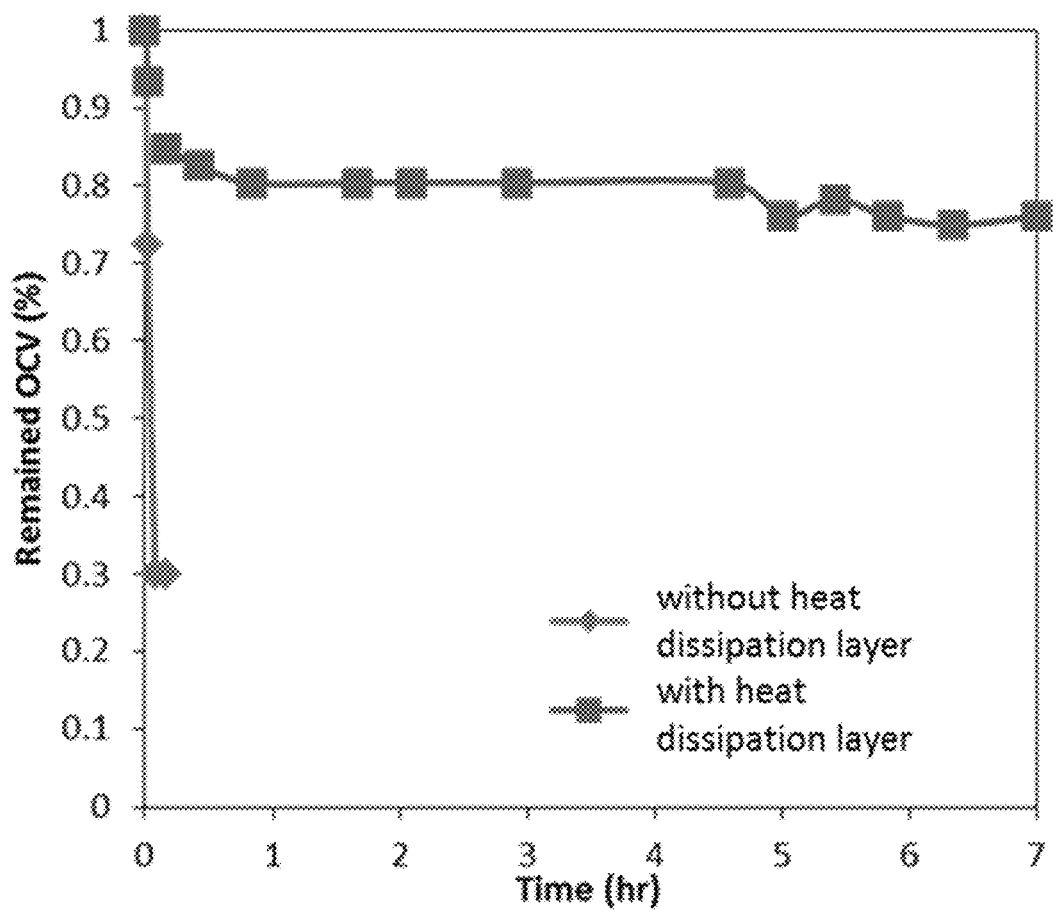
FIG. 9B is a plot showing remained open circuit voltage of flexible thermoelectric generators fabricated with a flexible heat dissipation layer and without a flexible heat dissipation layer according to certain embodiments.

A FTEG sample of flexible thermoelectric generator was fabricated as follows. $Bi_2Te_3$ semiconductor legs with a size of 1.2×1.2×2.0 $mm^3$ were used for both p-type and n-type. The semiconductor leg spacing of the sample was between 0.5-0.7 mm. 40 semiconductor legs in row and 12 semiconductor legs in column were arranged to provide 480 semiconductor legs. An effective area of the sample was 67.5×22.1 $mm^2$ (i.e., 14.9 $cm^2$). The electrode of the sample was GaIn eutectic. Pure PDMS was used for all polymer matrices. The sample had an internal resistance of 11.1 ohm and a thickness of 6.0 mm. A super absorption polymer (0.15 g) packed by cooling fabrics was put on top of the sample as a flexible heat dissipation layer. A hot side of the sample was kept at 32° C., and the open circuit voltage remains 70% for 7 hrs as shown in FIG. 9B. It demonstrates that the flexible heat dissipation layer can maintain the temperature difference over the sample for long time and improve continuous power output.

The present disclosure further provides a thermoelectric generator according to certain embodiments. The thermoelectric generator comprises: an thermoelectric conversion layer having a first surface and a second surface, and comprising a plurality of p-type semiconductor legs, a plurality of n-type semiconductor legs, and a flexible polymer matrix, wherein the first surface is opposite to the second surface, the plurality of p-type semiconductor legs and the plurality of n-type semiconductor legs define a plurality of thermoelectric couples and are embedded in the flexible polymer matrix in a way that both ends of each p-type semiconductor leg are exposed to the first surface and the second surface respectively, both ends of each n-type semiconductor leg are exposed to the first surface and the second surface respectively, and the plurality of p-type semiconductor legs and the plurality of n-type semiconductor legs are separated by the flexible polymer matrix; and a plurality of first electrode columns located on the first surface and arranged in parallel with a first axis of bending of the thermoelectric generator, each first electrode column comprising a plurality of first electrodes and a first flexible layer, the plurality of first electrodes being attached on the first flexible layer in at least one column and coupled to their respective thermoelectric couples.

In certain embodiments, the thermoelectric generator further comprises: a plurality of second electrode columns located on the second surface and arranged in parallel with a second axis of bending of the thermoelectric generator, each second electrode column comprising a plurality of second electrodes and a second flexible layer, the plurality of second electrodes being attached on the second flexible layer in at least one column and coupled to their respective thermoelectric couples, the second axis of bending being perpendicular to the first axis of bending. As the second axis of bending is perpendicular to the first axis of bending, the flexibility of the thermoelectric generator is increased since the thermoelectric generator can be bent along two axes, e.g., x-axis and y-axis.

In certain embodiments, the thermoelectric generator further comprises: a plurality of second electrodes located on the second surface and coupled to the plurality of thermoelectric couples; and a second flexible layer covering the plurality of second electrodes.

Figure 10A:
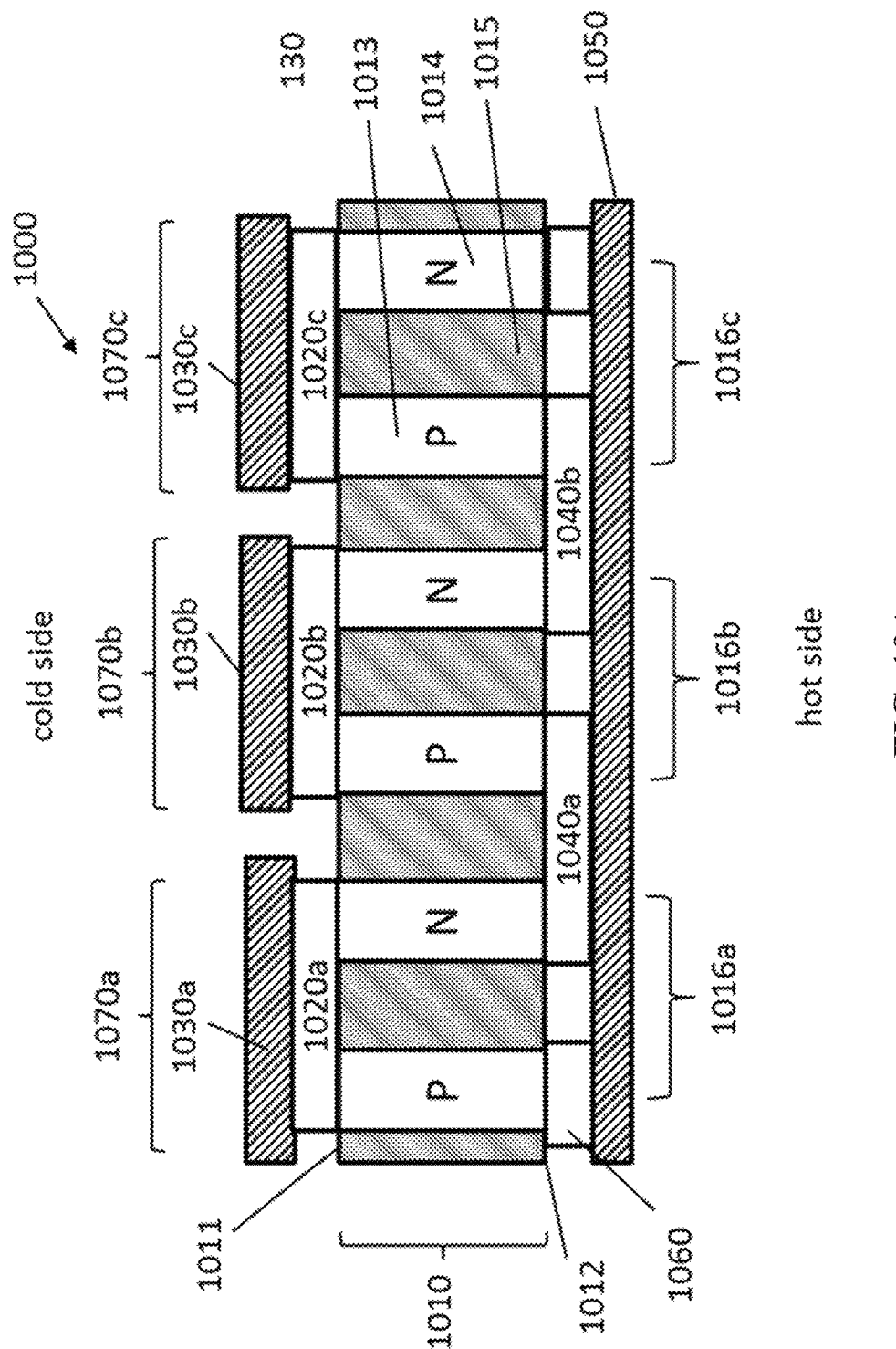
FIG. 10A is a schematic diagram depicting the cross section of a thermoelectric generator according to certain embodiments.

FIG. 10A is a schematic diagram depicting the cross section of a thermoelectric generator according to certain embodiments. The thermoelectric generator 1000 comprises a thermoelectric conversion layer 1010, a plurality of first electrode columns 1070a, 1070b, 1070c, a plurality of second electrodes 1040a, 1040b and a second flexible layer 1050.

The thermoelectric conversion layer 1010 has a first surface 1011 and a second surface 1012 and comprises a plurality of p-type semiconductor legs 1013, a plurality of n-type semiconductor legs 1014, and a flexible polymer matrix 1015. The first surface 1011 is opposite to the second surface 1012. The plurality of p-type semiconductor legs 1013 and the plurality of n-type semiconductor legs 1014 define a plurality of thermoelectric couples 1016a, 1016b, 1016c respectively and are embedded in the flexible polymer matrix 1015 in a way that both ends of each p-type semiconductor leg 1013 are exposed to the first surface 1011 and the second surface 1012 respectively, both ends of each n-type semiconductor leg 1014 are exposed to the first surface 1011 and the second surface 1012 respectively, and the plurality of p-type semiconductor legs 1013 and the plurality of n-type semiconductor legs 1014 are separated by the flexible polymer matrix 1015.

Figure 10B:
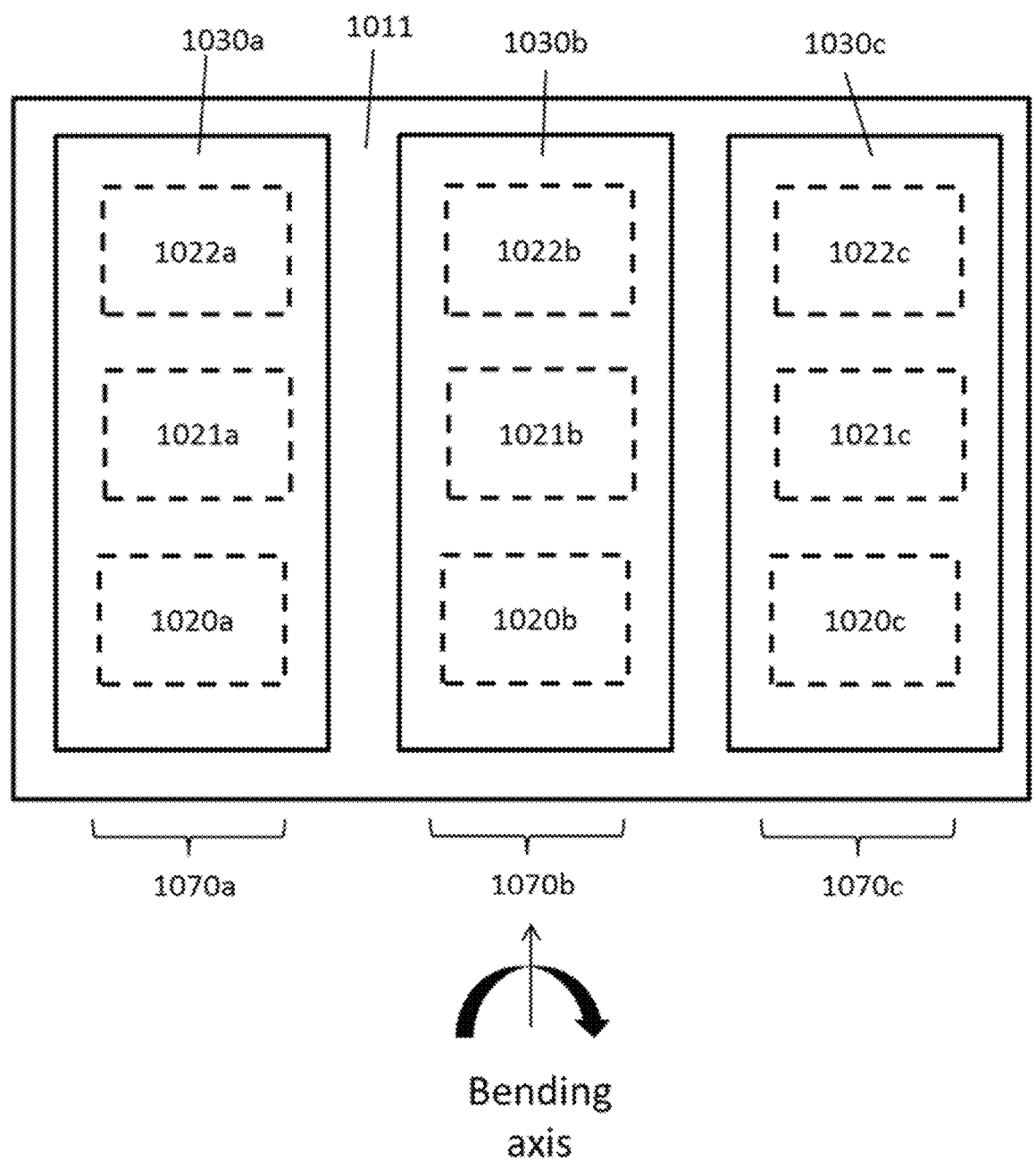
FIG. 10B is a schematic diagram depicting the top view of the thermoelectric generator of FIG. 10A.

As shown in FIG. 10B, the plurality of first electrode columns 1070a, 1070b, 1070c are located on the first surface 1011 and arranged in parallel with an axis of bending of the thermoelectric generator 1000. The first electrode column 1070a comprises three first electrodes 1020a, 1021a, 1022a and a first flexible layer 1030a, and the three first electrodes 1020a, 1021a, 1022a are attached on the first flexible layer 1030a in column and coupled to their respective thermoelectric couples. The first electrode column 1070b comprises three first electrodes 1020b, 1021b, 1022b and a first flexible layer 1030b, and the three first electrodes 1020b, 1021b, 1022b are attached on the first flexible layer 1030b in column and coupled to their respective thermoelectric couples. The first electrode column 1070c comprises three first electrodes 1020c, 1021c, 1022c and a first flexible layer 1030c, and the three first electrodes 1020c, 1021c, 1022c are attached on the first flexible layer 1030c in column and coupled to their respective thermoelectric couples.

Referring to FIG. 10A, the plurality of second electrodes 1040a, 1040b is located on the second surface 1012 and coupled to the plurality of thermoelectric couples 1016a, 1016b, 1016c. The second flexible layer 150 covers the plurality of second electrodes 1040a, 1040b.

In this embodiment, the thermoelectric generator further comprises two electrical terminal contacts 1060 for connecting the thermoelectric generator 1000 with a load.

Figure 10C:
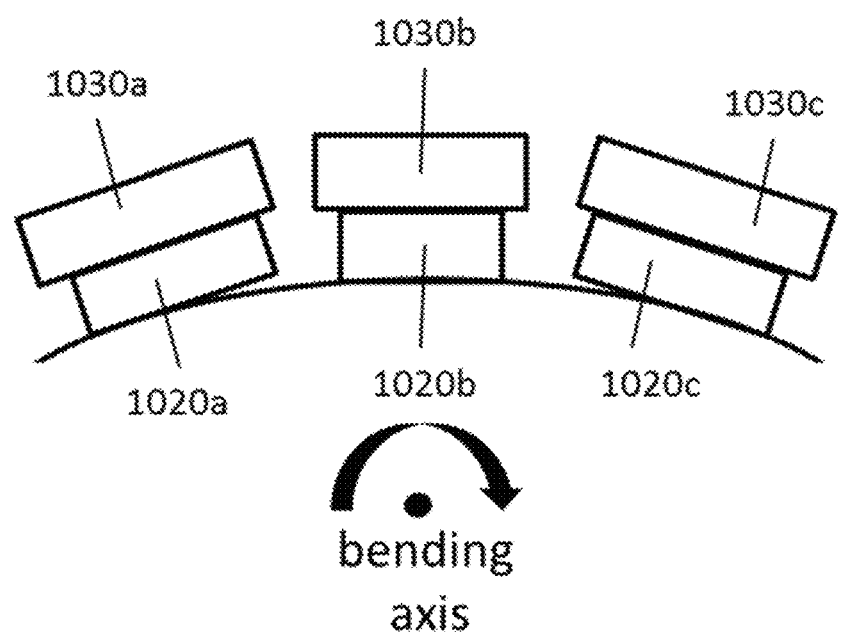
FIG. 10C is a schematic diagram depicting the thermoelectric generator of FIG. 10A under bending.

As shown in FIG. 10C, as the three first flexible layers 1030a, 1030b, 1030c are not connected, the three first flexible layers 1030a, 1030b, 1030c are not subjected to any tension or pressing during bending, such that the force exerted to the first electrodes and the thermoelectric conversion layer from the flexible layers can be substantially reduced. Thus, the disconnection between the first electrodes and the semiconductor legs can be substantially avoided, thereby enhancing the flexibility and reliability of the thermoelectric generator.

The present disclosure further provides a method for fabricating a thermoelectric generator according to certain embodiments. The method comprises: arranging the plurality of p-type semiconductor legs and the plurality of n-type semiconductor legs in an array; inserting a solution of the flexible polymer matrix among the plurality of p-type semiconductor legs and the plurality of n-type semiconductor legs; curing the solution of the flexible polymer matrix thereby forming the thermoelectric conversion layer; forming the plurality of first electrodes on a first substrate layer, the first substrate layer having the same material and thickness of each first flexible layer; attaching the plurality of first electrodes on the first substrate layer to the first surface of the thermoelectric conversion layer; separating the first substrate layer along the first axis of bending thereby forming the plurality of first electrode columns; forming the plurality of second electrodes on a second substrate layer, the second substrate layer having the same material and thickness of each second flexible layer; attaching the plurality of second electrodes on the second substrate layer to the second surface of the thermoelectric conversion layer; and separating the second substrate layer along the second axis of bending thereby forming the plurality of second electrode columns.

Figure 11:
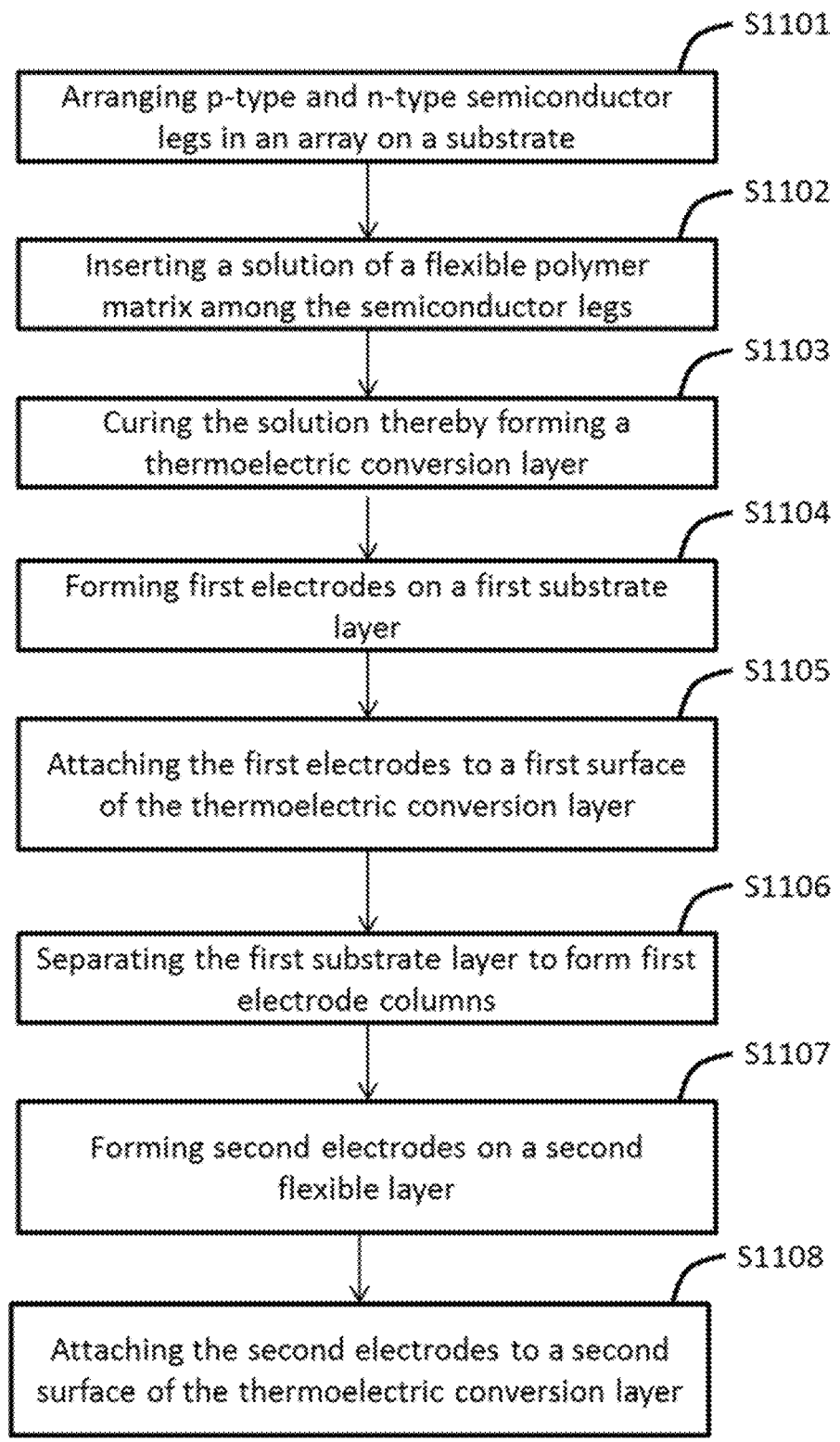
FIG. 11 is a flow chart depicting a method for fabricating a thermoelectric generator according to certain embodiments.

FIG. 11 is a flow chart depicting a method for fabricating a thermoelectric generator according to certain embodiments. In step S1101, p-type and n-type semiconductor legs are arranged in an array. In step S1102, a solution of a flexible polymer matrix is inserted among the p-type and n-type semiconductor legs. In step S1103, the solution of the flexible polymer matrix is cured thereby forming a thermoelectric conversion layer. In step S1104, a plurality of first electrodes is formed on a first substrate layer. In step S1105, the plurality of first electrodes on the first substrate layer is attached to a first surface of the thermoelectric conversion layer. In step S1106, the first substrate layer is separated into a plurality of first flexible layers along an axis of bending to form a plurality of electrode columns. In step S1107, a plurality of second electrodes is formed on a second flexible layer. In step S1108, the plurality of second electrodes is attached to the second surface of the thermoelectric conversion layer.

Figure 12:
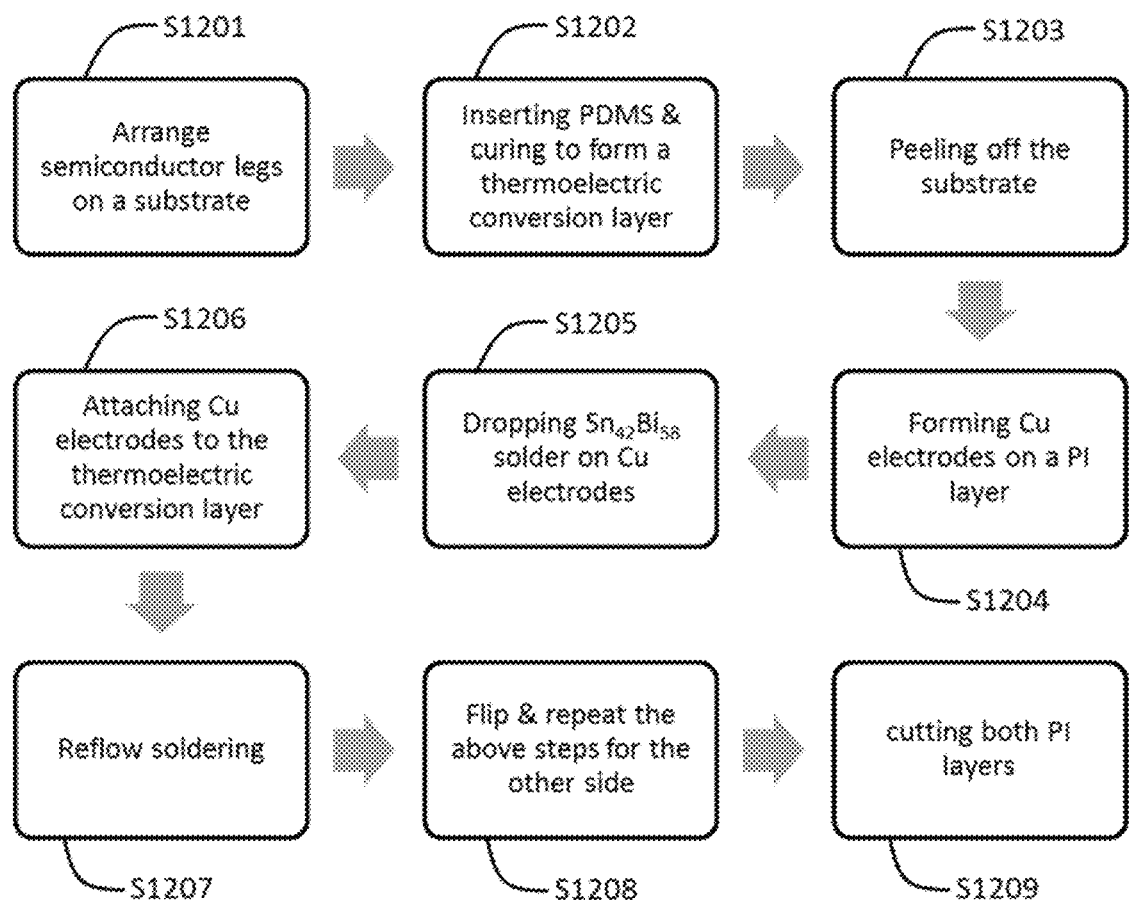
FIG. 12 is a flow chart depicting a method for fabricating a thermoelectric generator according to certain embodiments.

FIG. 12 is a flow chart depicting a method for fabrication a thermoelectric generator according to certain embodiments. In step S1201, p-type and n-type semiconductor legs are arranged in an array on a substrate. In step S1202, a PDMS solution is inserted among the p-type and n-type semiconductor legs and cured to form a thermoelectric conversion layer. In step S1203, the substrate is peeled off from the thermoelectric conversion layer. In step S1204, Cu electrodes are attached on a PI layer. In step S1205, $Sn_{42}Bi_{58}$ solder is dropped on the Cu electrodes. In step S1206, the Cu electrodes are attached to the thermoelectric conversion layer. In steps S1207, reflow soldering is performed for the thermoelectric conversion layer attached with the Cu electrodes. In step S1208, the thermoelectric conversion layer is flipped and the steps S1204-S1207 are repeated. In step S1209, the PI layer on the top side of the thermoelectric conversion layer is cut into a plurality of smaller PI layers along a first axis of bending and the PI layer on the bottom side of the thermoelectric conversion layer is cut into a plurality of smaller PI layers along a second axis of bending.

Example 4

A FTEG sample was fabricated as follows. $Bi_2Te_3$ semiconductor legs with a size of $1.2 \times 1.2 \times 2.0$ mm$^3$ were used for both p-type and n-type. The semiconductor leg spacing of the sample was between 1.0 mm. 24 semiconductor legs in row and 12 semiconductor legs in column are arranged to provide 288 semiconductor legs. An effective area of the sample was $51.8 \times 25.4$ mm$^2$ (i.e., 13.2 cm$^2$). The electrode of the sample comprised $Sn_{42}Bi_{58}$ solder and Cu. The polymer filled between the semiconductor legs was pure PDMS. Two PI layers were attached on the electrodes for both sides of sample, and the PI layer on the top side was cut into columns. The sample had an internal resistance of 5.7 ohm and a thickness of 2.0 mm.

The testing results of the FTEG sample are shown in Table 5.

TABLE 5

| Delta Temperature (T) °C. | Open circuit voltage (OCV) mV | Output voltage ($U_{out}$) mV | Output power ($P_{out}$) µW | Specific output power ($P_{out}$) µWcm$^{-2}$ |
|---|---|---|---|---|
| 1 | 45.6 | 28.8 | 82 | 6.5 |
| 2 | 91.2 | 57.6 | 328 | 25.2 |
| 3 | 136.8 | 86.4 | 739 | 56.8 |

TABLE 5-continued

| Delta Temperature (T) °C. | Open circuit voltage (OCV) mV | Output voltage ($U_{out}$) mV | Output power ($P_{out}$) µW | Specific output power ($P_{out}$) µWcm$^{-2}$ |
|---|---|---|---|---|
| 4 | 182.4 | 115.2 | 1314 | 101 |
| 5 | 228.0 | 144.0 | 2053 | 155.3 |

As shown in Table 5, the sample provides an output power of 2 mW when delta T is 5° C.

Thus, it can be seen that the improved thermoelectric generators have been disclosed which eliminates or at least diminishes the disadvantages and problems associated with prior art devices and processes. In accordance with certain embodiments, the thermoelectric generator comprise semiconductor legs and electrodes embedded in one or more flexible polymer matrices, which fix the position of the semiconductor legs and electrodes and provide protection to them to maintain good electric contacts among them during bending, thereby providing with high flexibility, reliability and output power. Besides the protection during bending, the one or more flexible polymer matrices can also reduce the degradation of semiconductor legs and electrodes by avoiding oxidation in air. For the thermoelectric generator comprising electrode columns in accordance with certain embodiments, its flexibility and reliability can also be enhanced. The fabrication methods of the disclosed thermoelectric generators are simple, thereby enabling large-scale manufacturing.

The thermoelectric generator of the present disclosure can be used for converting thermal energy into electrical energy, or converting electrical energy into thermal energy. The thermoelectric generator can be used as an electrical power source, a heater or a cooler. The thermoelectric generator can provide electrical power to lighting devices (e.g., LED), telecommunication device (e.g., for bluetooth, wifi), or sensors (e.g., thermometer, accelerometer, pressure sensor).

The thermoelectric generator of the present disclosure is applicable to electronics or textile industry, e.g., wearable electronics. The thermoelectric generator can be integrated into a fabric to covert body temperature of a user into electrical energy for driving a wearable device.

Although the invention has been described in terms of certain embodiments, other embodiments apparent to those of ordinary skill in the art are also within the scope of this invention. Accordingly, the scope of the invention is intended to be defined only by the claims which follow.

What is claimed is:

1. A thermoelectric generator comprising:
a thermoelectric conversion layer having a first surface and a second surface, the thermoelectric conversion layer comprising a plurality of p-type semiconductor legs, a plurality of n-type semiconductor legs and a first flexible polymer matrix having a first thermal conductivity, wherein the first surface is opposite to the second surface, the plurality of p-type semiconductor legs and the plurality of n-type semiconductor legs define a plurality of thermoelectric couples and are embedded in the first flexible polymer matrix in a way that both ends of each p-type semiconductor leg are exposed to the first surface and the second surface respectively, both ends of each n-type semiconductor leg are exposed to the first surface and the second surface respectively, and the plurality of p-type semiconductor legs and the plurality of n-type semiconductor legs are separated by the first flexible polymer matrix;
a plurality of first electrodes located on the first surface and coupled to the plurality of thermoelectric couples;
a first flexible layer comprising a second flexible polymer matrix, the second flexible polymer matrix having a second thermal conductivity and covering the plurality of first electrodes and an exposed area of the first surface, the exposed area of the first surface being an area not covered by the plurality of first electrodes, such that the first surface is fully covered by the plurality of first electrodes and the second flexible polymer matrix such that no void is present between the first flexible layer and the thermoelectric conversion layer such that the plurality of the first electrodes is fully embedded in the second flexible polymer matrix on the first surface for enhancing mechanical stability of connections between the plurality of first electrodes and the plurality of thermoelectric couples during bending;
a plurality of second electrodes located on the second surface and coupled to the plurality of thermoelectric couples; and
a second flexible layer comprising a third flexible polymer matrix, the third flexible polymer matrix having a third thermal conductivity and covering the plurality of second electrodes and an exposed area of the second surface, the exposed area of the second surface being an area not covered by the plurality of second electrodes, such that the second surface is fully covered by the plurality of second electrodes and the third flexible polymer matrix such that no void is present between the second flexible layer and the thermoelectric conversion layer such that the plurality of second electrodes is fully embedded in the third flexible polymer matrix on the second surface for enhancing mechanical stability of connections between the plurality of second electrodes and the plurality of thermoelectric couples during bending.

2. The thermoelectric generator of claim 1, wherein both of the second thermal conductivity and the third thermal conductivity are higher than the first thermal conductivity.

3. The thermoelectric generator of claim 1, wherein the first thermal conductivity is between 0.1 W/mK and 0.5 W/mK, the second thermal conductivity is between 0.5 W/mK and 3 W/mK, the third thermal conductivity is between 0.5 W/mK and 3 W/mK.

4. The thermoelectric generator of claim 1, wherein the first flexible polymer matrix has a composition comprising a first polymer, and both of the second flexible polymer matrix and the third flexible polymer matrix have a composition comprising a second polymer and one or more fillers.

5. The thermoelectric generator of claim 4, wherein the first polymer is polydimethylsiloxane (PDMS), thermoplastic polyurethane (TPU), or ethylene-vinyl acetate copolymer (EVA), and the second polymer is PDMS, TPU, EVA, or polyimide (PI).

6. The thermoelectric generator of claim 4, wherein the one or more fillers are silicon carbide (SiC), boron nitride (BN), aluminum oxide ($Al_2O_3$), aluminum nitride (AlN), graphite, a carbon nanotube (CNT), or a combination thereof.

7. The thermoelectric generator of claim 4, wherein the first polymer is PDMS, the second polymer is PDMS, the one or more fillers have two fillers including a combination of BN and AlN, a combination of BN and SiC, or a combination of AlN+$Al_2O_3$.

8. The thermoelectric generator of claim 1, wherein the thermoelectric generator has a thickness between 4.0 mm and 4.5 mm, the first flexible layer has a thickness between 1.5 mm and 1.0 mm, and the second flexible layer has a thickness between 1.5 mm and 1.0 mm.

9. The thermoelectric generator of claim 1, wherein the each p-type semiconductor leg comprises bismuth telluride ($Bi_2Te_3$), bismuth selenide ($Bi_2Se_3$), antimony telluride ($Sb_2Te_3$), $(Bi,Sb)_2Te_3$, iron antimonide ($FeSb_2$), lead telluride (PbTe), tin selenide (SnSe), or bismuth antimonide (BiSb), the each n-type semiconductor leg comprises $Bi_2Te_3$, $Bi_2Se_3$, $Sb_2Te_3$, $(Bi,Sb)_2Te_3$, $FeSb_2$, PbTe, SnSe, or BiSb.

10. The thermoelectric generator of claim 1, wherein the each p-type semiconductor leg has a size of 1.2 mm×1.2 mm×2.0 mm, and the each n-type semiconductor leg has a size of 1.2 mm×1.2 mm×2.0 mm.

11. The thermoelectric generator of claim 1, wherein the each first electrode comprises copper (Cu), silver (Ag), gallium-indium eutectic (EGaIn), or a conductive fabric, and the each second electrode comprises Cu, Ag, EGaIn, or the conductive fabric.

12. The thermoelectric generator of claim 1 further comprising a flexible heat dissipation layer attaching on the first flexible layer or the second flexible layer.

13. The thermoelectric generator of claim 12, wherein the flexible heat dissipation layer comprises a super absorption polymer, a cooling fabric, a water absorption paper, a phase change material, a metal foam, or a thermal conductive glue.

\* \* \* \* \*